US010184961B2

(12) United States Patent
Schrom et al.

(10) Patent No.: US 10,184,961 B2
(45) Date of Patent: Jan. 22, 2019

(54) CURRENT BALANCING, CURRENT SENSOR, AND PHASE BALANCING APPARATUS AND METHOD FOR A VOLTAGE REGULATOR

(71) Applicant: Intel Corporation, Santa Clara, CA (US)

(72) Inventors: Gerhard Schrom, Hillsboro, OR (US); J. Keith Hodgson, Hillsboro, OR (US); Alexander Lyakhov, Haifa (IL); Chiu Keung Tang, Folsom, CA (US); Narayanan Raghuraman, Beaverton, OR (US); Narayanan Natarajan, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/276,697

(22) Filed: Sep. 26, 2016

(65) Prior Publication Data
US 2017/0030947 A1 Feb. 2, 2017

Related U.S. Application Data

(63) Continuation of application No. 14/543,346, filed on Nov. 17, 2014, which is a continuation of application
(Continued)

(51) Int. Cl.
*H03M 1/66* (2006.01)
*G01R 19/00* (2006.01)
(Continued)

(52) U.S. Cl.
CPC ............ *G01R 19/0092* (2013.01); *G06T 3/40* (2013.01); *H02M 1/088* (2013.01); *H02M 3/156* (2013.01);
(Continued)

(58) Field of Classification Search
CPC .. G01R 19/0092; H02M 3/158; H02M 1/088; H02M 3/156; H02M 3/157;
(Continued)

(56) References Cited

U.S. PATENT DOCUMENTS 6,166,528 A * 12/2000 Rossetti .............. H02M 3/1588
323/283
6,642,752 B1 11/2003 Nagaraj
(Continued)

FOREIGN PATENT DOCUMENTS

CN 1297283 5/2001
CN 201118434 9/2008
(Continued)

OTHER PUBLICATIONS

Ex Parte Quayle for U.S. Appl. No. 14/543,346.
(Continued)

*Primary Examiner* — Jean B Jeanglaude
(74) *Attorney, Agent, or Firm* — Green, Howard & Mughal LLP

(57) ABSTRACT

Described are apparatuses and methods of current balancing, current sensing and phase balancing, offset cancellation, digital to analog current converter with monotonic output using binary coded input (without binary to thermometer decoder), compensator for a voltage regulator (VR), etc. In one example, apparatus comprises: a plurality of inductors coupled to a capacitor and a load; a plurality of bridges, each of which is coupled to a corresponding inductor from the plurality of inductors; and a plurality of current sensors, each of which is coupled to a bridge to sense current through a transistor of the bridge.

32 Claims, 26 Drawing Sheets

Related U.S. Application Data

No. 13/930,559, filed on Jun. 28, 2013, now Pat. No. 8,890,737.

(60) Provisional application No. 61/799,833, filed on Mar. 15, 2013, provisional application No. 61/829,992, filed on May 31, 2013.

(51) Int. Cl.

| | | |
|---|---|---|
| *H02M 3/157* | (2006.01) | |
| *H03L 5/00* | (2006.01) | |
| *G06T 3/40* | (2006.01) | |
| *H02M 3/156* | (2006.01) | |
| *H02M 1/088* | (2006.01) | |
| *H02M 3/158* | (2006.01) | |
| *H03M 1/68* | (2006.01) | |
| *H02M 1/00* | (2006.01) | |

(52) U.S. Cl.
CPC ........... *H02M 3/157* (2013.01); *H02M 3/158* (2013.01); *H03L 5/00* (2013.01); *H03M 1/66* (2013.01); *H02M 2001/0009* (2013.01); *H02M 2003/1566* (2013.01); *H03M 1/685* (2013.01)

(58) Field of Classification Search
CPC .. H02M 2001/0009; H02M 2003/1566; H03L 5/00; G06T 3/40; H03M 1/685; H03M 1/66; H03M 1/747
USPC .................................................. 341/144, 145
See application file for complete search history.

(56) References Cited

U.S. PATENT DOCUMENTS

| | | | |
|---|---|---|---|
| 6,690,589 B2 | 2/2004 | Barnett et al. | |
| 7,180,278 B2* | 2/2007 | Tai ...................... | H02M 3/1588 323/277 |
| 7,436,158 B2* | 10/2008 | Huang .................. | H02M 3/158 323/224 |
| 7,605,609 B1 | 10/2009 | Andrews et al. | |
| 7,656,200 B2 | 2/2010 | Hyvonen | |
| 8,169,224 B2* | 5/2012 | Sander ................ | G01R 19/0092 323/315 |
| 8,289,732 B2* | 10/2012 | Li ...................... | H02M 3/33515 363/21.12 |
| 8,680,821 B2 | 3/2014 | Vogman | |
| 8,890,737 B2* | 11/2014 | Schrom ................. | H02M 3/157 341/144 |
| 9,407,142 B2* | 8/2016 | Yang ..................... | H02M 3/156 |
| 2003/0218455 A1 | 11/2003 | Tai et al. | |
| 2004/0008011 A1 | 1/2004 | Wang et al. | |
| 2004/0217741 A1 | 11/2004 | Muratov et al. | |
| 2007/0288188 A1 | 12/2007 | Kahr et al. | |
| 2009/0167579 A1 | 7/2009 | Kawano | |
| 2011/0133704 A1 | 6/2011 | Zambetti et al. | |
| 2012/0161740 A1 | 6/2012 | Vogman | |
| 2012/0229107 A1 | 9/2012 | Chen | |
| 2012/0293155 A1* | 11/2012 | Chan ................... | H02M 3/1584 323/317 |
| 2014/0176095 A1* | 6/2014 | Yang ..................... | H02M 3/156 323/271 |
| 2014/0266119 A1* | 9/2014 | Burton .................. | H02M 3/157 323/283 |
| 2015/0137778 A1* | 5/2015 | Miyazaki .............. | H02M 3/156 323/271 |
| 2016/0349288 A1* | 12/2016 | Barnette .............. | G01R 15/146 |

FOREIGN PATENT DOCUMENTS

| | | |
|---|---|---|
| CN | 101471667 | 7/2009 |
| CN | 102790526 | 6/2015 |
| DE | 10038372 | 3/2003 |
| DE | 102006019681 | 11/2007 |
| TW | 201233027 | 8/2012 |
| TW | 201249086 | 12/2012 |
| TW | M443985 | 12/2012 |

OTHER PUBLICATIONS

Non-Final Office Action, dated Apr. 18, 2014, for U.S. Appl. No. 13/930,559.
Non-Final Office Action, dated Apr. 26, 2016, for U.S. Appl. No. 14/543,346.
Notice of Allowance for Patent Application No. 104139429, dated Feb. 7, 2017.
Notice of Allowance, dated Jul. 21, 2014 for U.S. Appl. No. 13/930,559.
Notice of Allowance, dated Oct. 6, 2016, for U.S. Appl. No. 14/543,346.
Notice of Allowance, dated Oct. 23, 2015 for Taiwanese Patent Application No. 103109085.
Office Action and Search Report, dated Apr. 20, 2015, for Taiwanese Patent Application No. 103109085.
Office Action and Search Report, dated Aug. 22, 2016, for TW Patent Application No. 104139429.
Office Action, dated Nov. 7, 2016, for German Patent Application No. 102014003791.6.
Office Action, dated Dec. 4, 2014, for German Patent Application No. 102014003791.6.
Notice of Allowance for U.S. Appl. No. 14/543,346.
Office Action for German Patent Application No. 10 2014 019 830.8, dated Feb. 9, 2017.
Office Action and Search Report for Taiwan Patent Application No. 105138269, dated Nov. 30, 2017.
Notice of Allowance for Taiwan Patent Application No. 105138269, dated May 31, 2018.

* cited by examiner

CURRENT BALANCING, CURRENT SENSOR, AND PHASE BALANCING APPARATUS AND METHOD FOR A VOLTAGE REGULATOR

CLAIM OF PRIORITY

This application is a Continuation of U.S. patent application Ser. No. 14/543,346, filed Nov. 17, 2014, which claims the benefit of priority of U.S. application Ser. No. 13/930,559 filed Jun. 28, 2013, issued as U.S. Pat. No. 8,890,737 on Nov. 18, 2014, and claims the benefit of priority of U.S. Provisional Application 61/799,833 filed Mar. 15, 2013, titled "Integrated Voltage Regulators," and U.S. Provisional Application 61/829,992 filed May 31, 2013 titled "On-Chip Compensator for an Integrated Voltage Regulator," which are incorporated by reference in their entirety.

BACKGROUND

DC-DC converters typically generate a DC (direct current) voltage by full wave rectifying and filtering one or more time varying signals. Because of the switching undertaken in the full wave rectification process, significant amounts of current are frequently "switched" back-and-forth at rapid pace by large transistors. It is often helpful to measure the current through these transistors to, for instance, determine whether or not the DC-DC converter is being loaded, monitor any ripple currents resulting from switching, etc.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
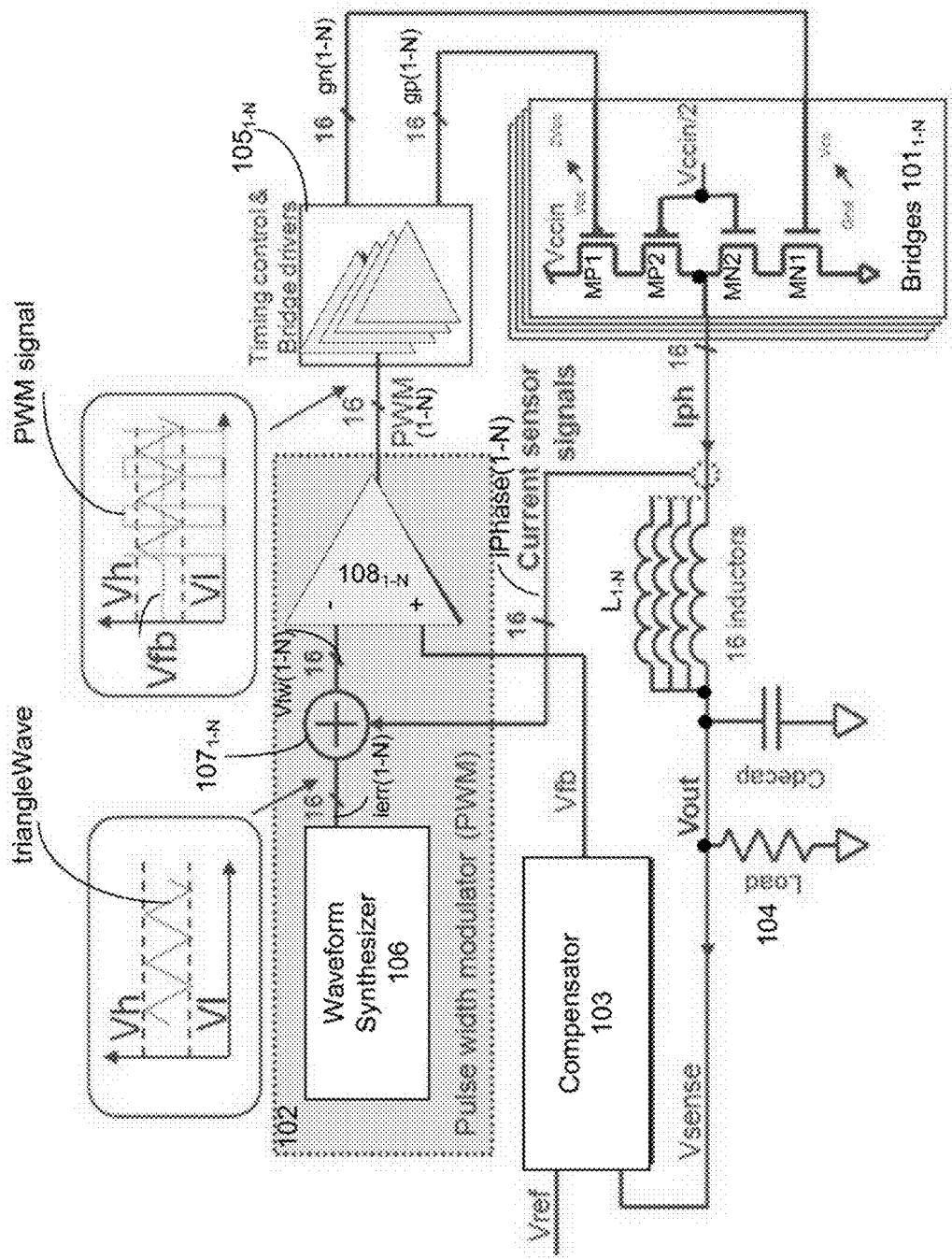
FIG. 1 is a voltage regulator with phase and current balancing, according to one embodiment of the disclosure.

The embodiments describe apparatus and method of current balancing, current sensing and phase balancing, offset cancellation, digital to analog current converter with monotonic output using binary coded input (without binary to thermometer decoder), compensator for a voltage regulator (VR), etc. The embodiments have numerous technical effects, including improving reliability of VR, improving efficiency of VR, reducing power consumption, etc.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 is a VR 100 with phase and current balancing, according to one embodiment of the disclosure. Typical VRs may generate phase current that differ between phases. For example, a phase may deliver 1 A current, and another phase may deliver 4 A current. This phase current mismatch causes the VR to lose its efficiency, and also contributes to voltage error in the related output voltage. The following embodiment solves at least the above problem.

In one embodiment, VR 100 comprises a plurality of bridges $101_{1-N}$, where 'N' is greater than one; a pulse width modulator (PWM) 102, and a compensator 103. In this example, N=16. However, the embodiments are not limited to N=16. Any number of 'N' may be used. In one embodiment, plurality of bridges $101_{1-N}$ are coupled to a plurality of inductors $L_{1-N}$ which in turn are coupled to a load capacitor (or decoupling capacitor) Cdecap, and load 104. The voltage Vout of the capacitor is the regulated output voltage. In one embodiment, compensator 103 receives a reference voltage Vref and output voltage Vout (same as Vsense) to generate a modified reference voltage Vfb (feedback voltage) for PWM 102. In one embodiment, output of each of the bridges of plurality of bridges $101_{1-N}$ is coupled to an inductor L from among the plurality of inductors $L_{1-N}$. For example, inductor $L_1$ is coupled to bridge $101_1$. In one embodiment, a plurality of current sensors (not shown) are coupled to plurality of bridges $101_{1-N}$ and are operable to sense current iPhase(1-N) for each bridge (or phase).

In one embodiment, PWM 102 generates a plurality of pulse width modulated signals, PWM(1-N) signals, for timing control and bridge drivers $105_{1-N}$. In one embodiment, outputs gn(1-N) and gp(1-N) of timing control and bridge drivers $105_{1-N}$ are used to control plurality of bridges $101_{1-N}$ to generate the regulated voltage Vout.

In one embodiment, PWM 102 comprises wave synthesizer 106, current mixer $107_{1-N}$, and comparator $108_{1-N}$. In one embodiment, wave synthesizer 106 (also referred as wave generator) generates 'N' number of triangular waves. In one embodiment, the triangular waves are periodic and have a voltage swing between Vh (high voltage threshold) and Vl (low voltage reference).

In one embodiment, comparator $108_{1-N}$ generates 'N' number of PWM signals (i.e., PWM(1-N) signals), each of which drives a corresponding timing control and bridge driver from among timing control and bridge drivers $105_{1-N}$. In one embodiment, PWM signals (i.e., PWM(1-N) signals) have a duty cycle which varies with DC levels of inputs to comparators $108_{1-N}$. The strength of current output by bridges $101_{1-N}$, ripple in current, and voltage Vout depends on the duty cycle of PWM(1-N) signals.

In one embodiment, current mixers $107_{1-N}$ receives sensed phase currents (iPhase(1-N)) of each bridge from among bridges $101_{1-N}$ and subtract average current from all bridges $101_{1-N}$ to generate error currents ierr(1-N) which is used to generate corresponding voltage Vtw(1-N) for inputs of corresponding comparators $108_{1-N}$. For example, current mixer $107_1$ receives iPhase1 from bridge $101_1$ and subtracts average current from iPhase1 to generate ierr1 which is used to generate Vtw1 for comparator $108_1$. In such an embodiment, output current of all bridges $101_{1-N}$ is substantially balanced resulting in phase balancing.

In one embodiment, current sensor signals (iPhase(1-N)) are combined and added (or subtracted) by current mixers $107_{1-N}$ to the main VR loop at the junction of output of waveform synthesizer 106 and comparators $108_{1-N}$. In such an embodiment, the main VR loop (including PWM 102→bridge drivers $105_{1-N}$→bridges $101_{1-N}$→compensator 103) regulates the output voltage Vout while the current sensing loop (including current mixers $107_{1-N}$→comparators $108_{1-N}$→bridge drivers $105_{1-N}$→bridges $101_{1-N}$→current sensors (not explicitly shown)) checks and maintains that all phases (i.e., bridges $101_{1-N}$) generate the same amount of current.

The triangle wave (i.e., output of waveform synthesizer 106) of each phase (or bridge) is shifted up or down by an amount proportional to $I_{err}=I_{ph}-I_{avg}$, where $I_{err}$ is the difference between the individual phase's current and the average current of all the phases. In one embodiment, shifting the triangle wave up reduces the PWM duty cycle which decreases phase current, and shifting the triangle wave down increases the PWM duty cycle which increases phase current (i.e., from output of bridge from among bridge $101_{1-N}$).

Figure 2:
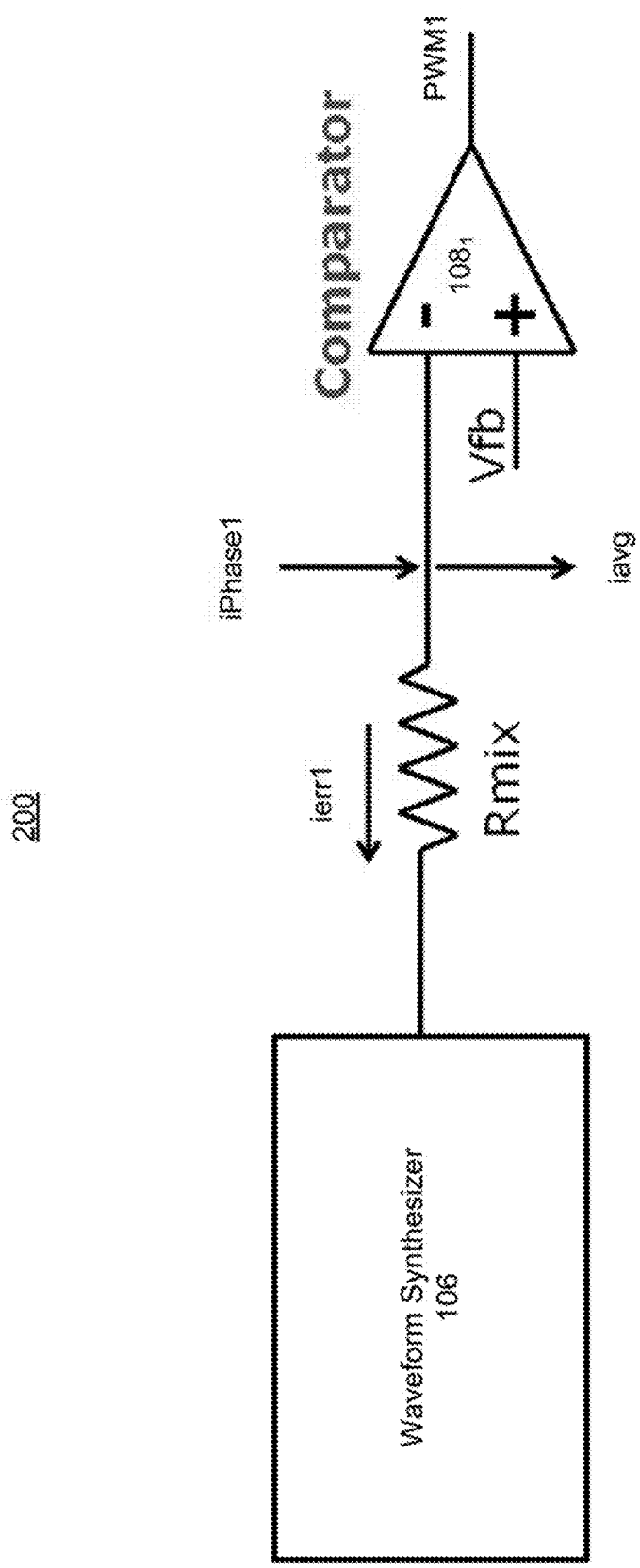
FIG. 2 is a phase balancing circuit, according to one embodiment of the disclosure.

FIG. 2 is a phase balancing circuit 200, according to one embodiment of the disclosure. It is pointed out that those elements of FIG. 2 having the same reference numbers (or names) as the elements of any other figure can operate or function in any manner similar to that described, but are not limited to such.

In this embodiment, a current mixer Rmix (from among current mixers $107_{1-N}$) is coupled to wave synthesizer 106 and comparator $108_1$. So as not to obscure the embodiments, bridge $101_1$, current mixer $107_1$, comparator $108_1$, inductor $L_1$, are explained with reference to phase 1. The same explanation applies to other phases. In one embodiment, every phase may have its own current error. In one embodiment, current sensor output is a current-mode signal iPhase1 and is proportional to the bridge current.

In one embodiment, the phase current iPhase1 is applied as a positive signal while average current iavg is applied as a negative signal. In one embodiment, the link between waveform synthesizer 106 and inputs of comparators $108_{1-N}$ are current mixers $107_{1-N}$. In one embodiment, each of the current mixer (from among current mixers $107_{1-N}$) mixes the positive phase current and minuses average current (iavg) signals together so that the difference in the currents flows through the current mixer creating a respective voltage drop Vtw. In one embodiment, this voltage is what shifts the triangle wave up or down. The value of the triangle wave shift is given by $\Delta Vtri=R_{mix}*(I_{ph}-I_{avg})$. In one embodiment, the current balancing scheme of FIG. 1 is based on average current and not peak current.

In one embodiment, each phase in the VR 100 has a mixer resistor Rmix which receives the positive current signal generated by its own phase (e.g., iPhase1) as well as a minus average signal (i.e., iavg), which is the same for all phases. In one embodiment, the positive phase current signal is created by folding the differential current signal from the power train (e.g., bridge $101_1$) into a single-ended signal with a positive sign. In one embodiment, the minus average signal (i.e., −iavg) is created in a similar fashion.

In one embodiment, the polarity of inputs to the differential-to-single-ended circuit for the average current generation is reversed, giving it a gain of −1 when compared to the phase current signal. In one embodiment, the output of a minus average current cell is divided into many separate outputs, one for each phase in the VR 100. For 'N' phases, there are N outputs, each with 1/N strength compared to the original output. These outputs are then distributed equally to the other average current generation cells, such that the total minus average current signal for a particular phase is actually a combination of single 1/N outputs from each of the N phases. In one embodiment, the signals involved are in current mode, so the addition of these outputs is accomplished by shorting them together.

For example, for a 4-phase VR, the mixer resistor Rmix for phase 1 receives the full phase current signal and a ¼ average signal from each of the four phases. If the current in phase 1 is equal to the average current, then no current will flow on Rmix1 (i.e., $107_1$) and the triangle wave will be unchanged. In this embodiment, the other phases' Rmix gets one branch from the average current cell in phase 1 (as well as one branch from each of the other phases). In one embodiment, only the phase-current signals are used without subtracting the average current. In such an embodiment, VR 100 operates in a form of current-mode control, which can be used to improve transient performance.

Figure 3:
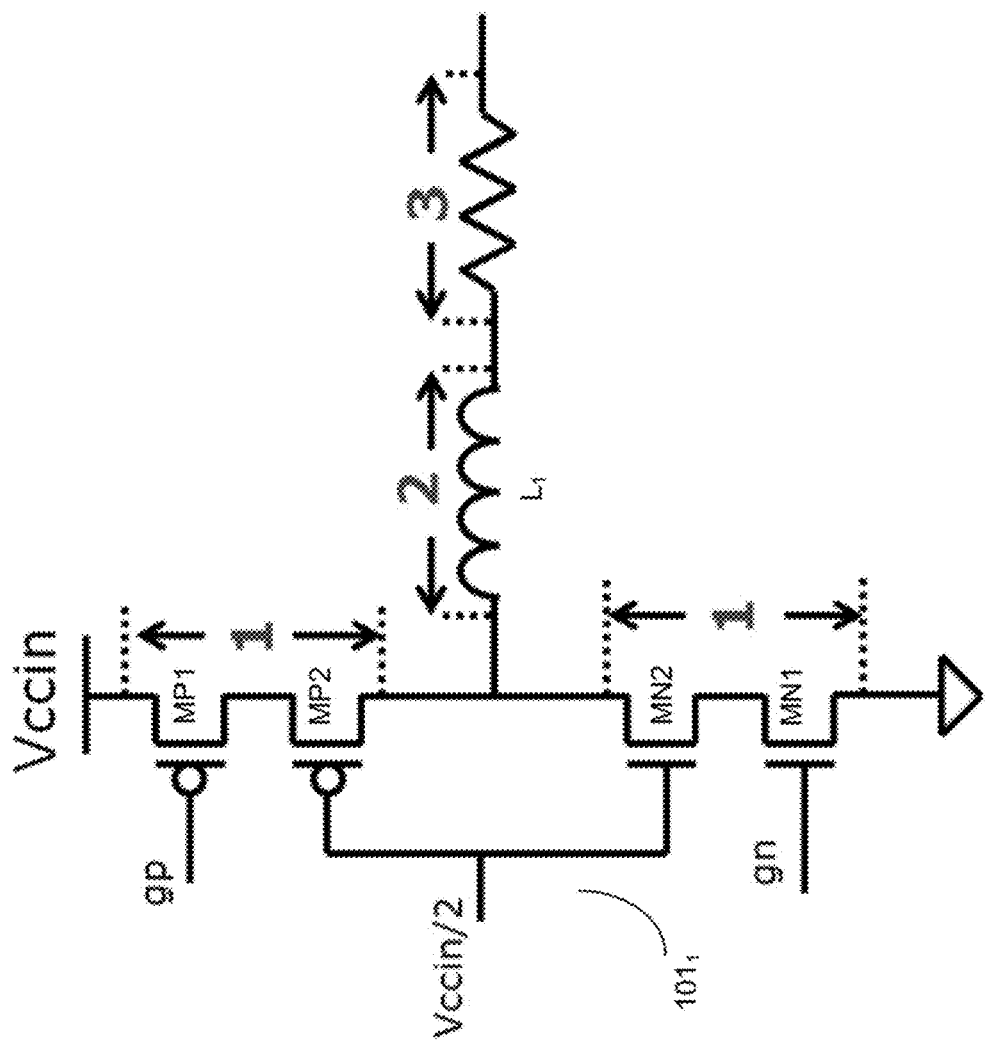
FIG. 3 illustrates current sensing locations, according to one embodiment of the disclosure.

FIG. 3 illustrates current sensor locations 300, according to one embodiment of the disclosure. It is pointed out that those elements of FIG. 3 having the same reference numbers (or names) as the elements of any other figure can operate or function in any manner similar to that described, but are not limited to such.

In this embodiment, a bridge $101_1$ and corresponding output inductor $L_1$ are shown. In one embodiment, current sensor can be located at positions '1,' '2,' or '3' as indicated.

Position '2' is referred as shunt inductance technique which induces a current measurement signal in an inductor by coupling magnetic fields that are produced by the current signal being measured through the inductor. Unfortunately, shunt inductance is not practical for rapidly changing currents because the bandwidth of an inductor is limited (i.e., the inductor will increasingly attenuate the current measurement signal as its frequency increases.

Position '3' is referred as the series resistance technique. Series resistance technique does not typically suffer from limited bandwidth issues because a pure resistance does not change its resistive properties as a function of signal frequency. Unfortunately, however, the series resistance technique is also not practical for large currents (such as those drawn by a DC-DC converter's switching transistors) because a large current being driven through a resistance will tend to dissipate large amounts of power (through the relationship $P=I^2R$) which may result in overheating; or, if the power "problem" is handled by using a very small series resistance, inaccuracy results because the signal V=I*R may become too small to measure.

The embodiments use position '1' where current sensors sense current across p-type devices MP1 and/or MP2 (which form the high-side switch), and n-type devices MN2 and/or MN1 (which form the low-side switch).

Figure 4:
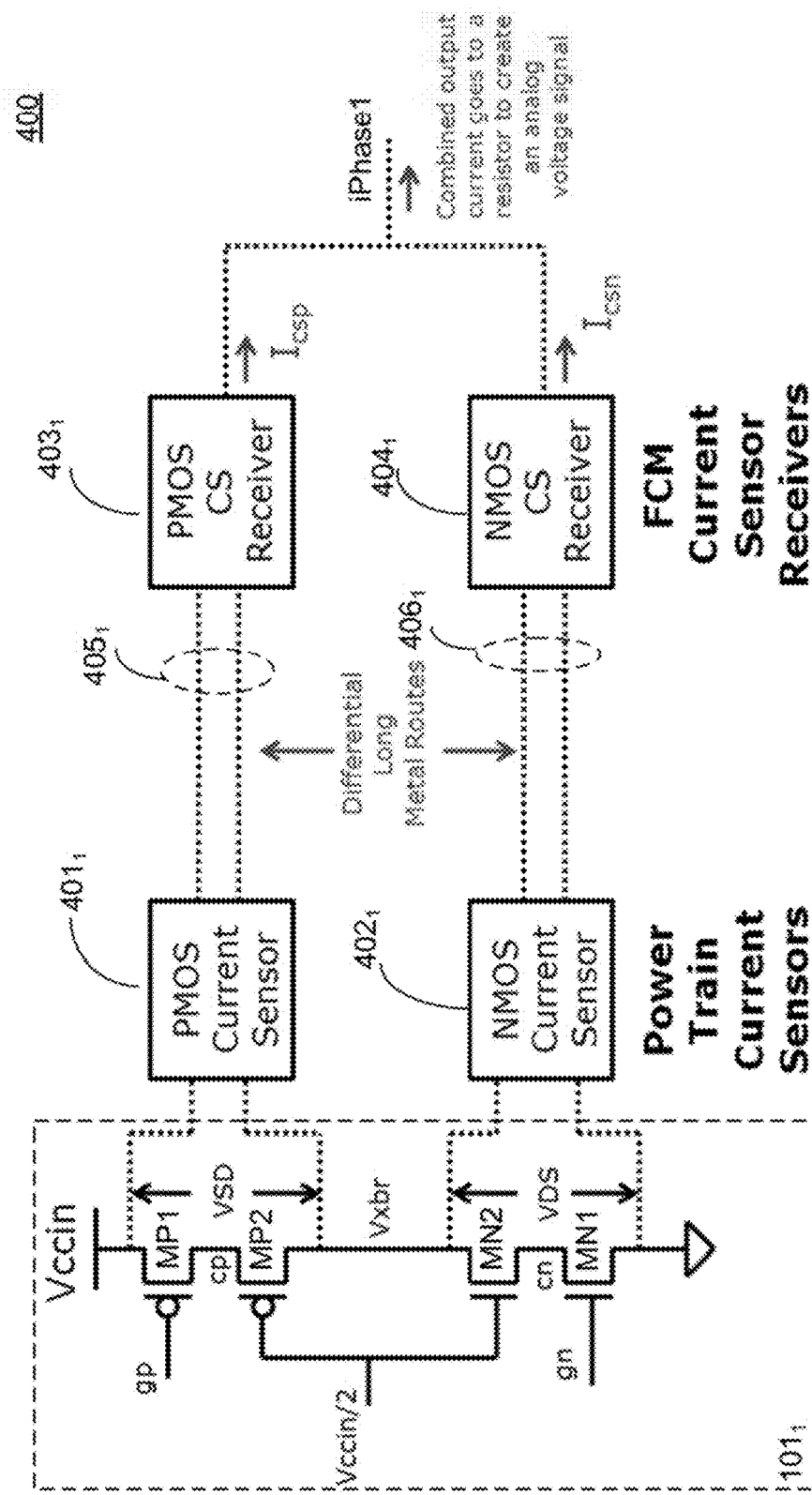
FIG. 4 is a circuit with a bridge and n-type and p-type current sensors, according to one embodiment of the disclosure

FIG. 4 is a circuit 400 with a bridge and n-type and p-type current sensors, according to one embodiment of the disclosure. It is pointed out that those elements of FIG. 4 having the same reference numbers (or names) as the elements of any other figure can operate or function in any manner similar to that described, but are not limited to such.

In one embodiment, circuit 400 comprises bridge $101_1$, p-type (e.g., PMOS) current sensor $401_1$, n-type (e.g., NMOS) current sensor $402_1$, p-type current sensor (CS) receiver $403_1$, and n-type current sensor receiver $404_1$. While the embodiments are explained with reference to one phase of bridge, the same explanation applies to other bridges/phases.

In this embodiment, output of p-type current sensor $401_1$ is routed over metal routes $405_1$ to p-type current sensor receiver $403_1$. In this embodiment, output of n-type current sensor $402_1$ is routed over metal routes $406_1$ to n-type current sensor receiver $404_1$. In one embodiment, outputs of p-type current sensor receiver $403_1$ and n-type current sensor receiver $404_1$ are combined to generate iPhase1 current representing phase current of bridge $101_1$. In one embodiment, all bridges $101_{1-N}$ have their respective p-type and n-type current sensors and corresponding p-type and n-type current sensor receivers to generate their corresponding iPhase currents.

In one embodiment, p-type and n-type current sensors $401_1$ and $402_1$ determine the load current by detecting the drain-source voltage ($V_{DS}$ or $V_{SD}$) drop on the conducting half of bridge $101_1$. For example, for NMOS (i.e., low-side switch having MN2 and MN1) $V_{DS}$=Vxbr−Vss; and for PMOS (i.e., high-side switch having MP1 and MP2) $V_{SD}$=Vccin−Vxbr, where Vxbr is the bridge output. The current sensing embodiment of FIG. 4 reduces power loss by eliminating the need to add an additional series resistance.

Figure 5:
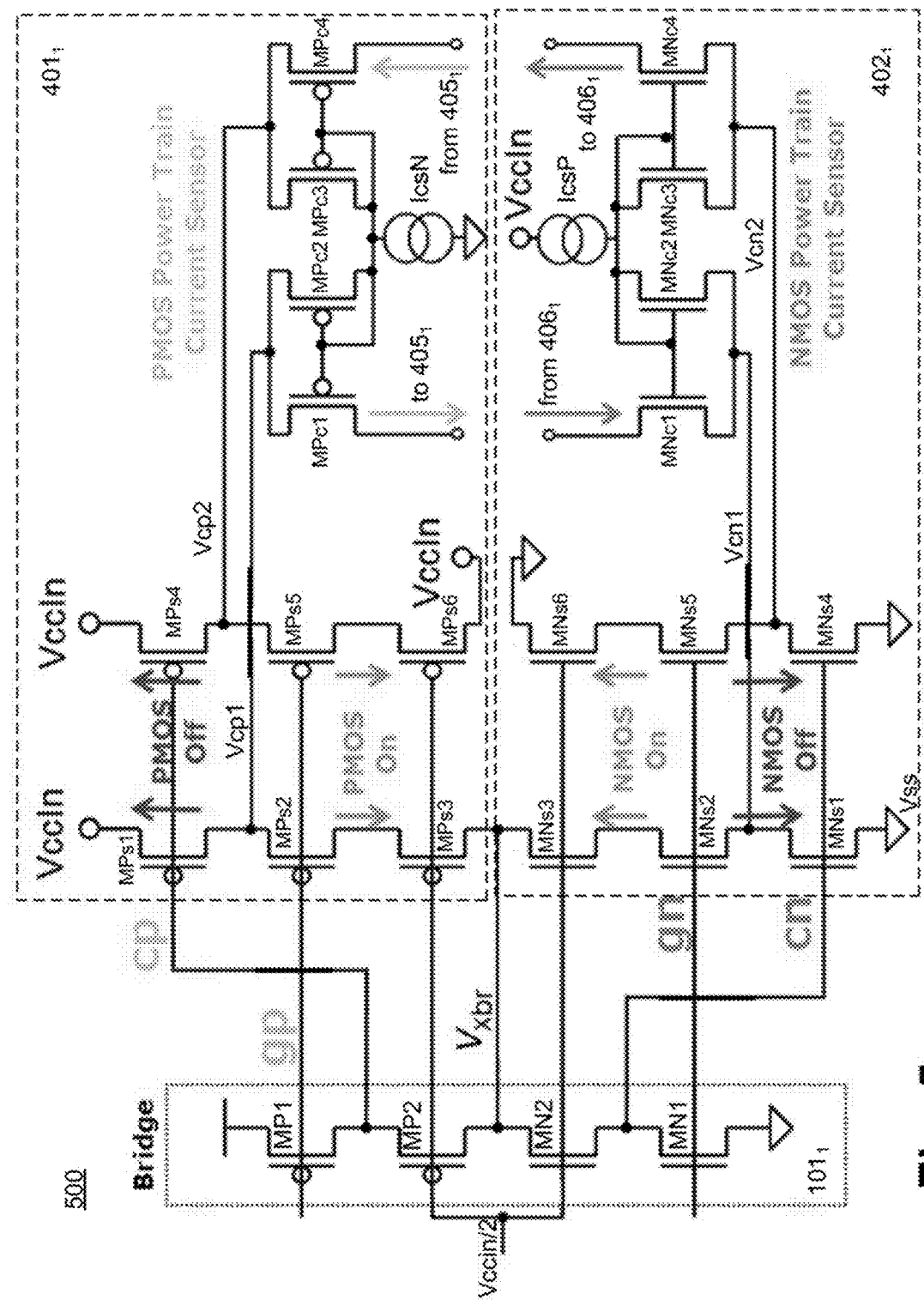
FIG. 5 is a transistor level architecture of n-type and p-type current sensors, according to one embodiment of the disclosure.

FIG. 5 is a transistor level architecture 500 of n-type and p-type current sensors, according to one embodiment of the disclosure. It is pointed out that those elements of FIG. 5 having the same reference numbers (or names) as the elements of any other figure can operate or function in any manner similar to that described, but are not limited to such.

In one embodiment, transistor level architecture 500 comprises bridge $101_1$ and current sensors i.e., p-type current sensor $401_1$ and n-type current sensor $402_1$. In one embodiment, p-type current sensor $401_1$ comprises a first stack of cascode devices including p-type MPs1, MPs2, and MPs3 coupled together as shown, and a second stack of cascode devices including p-type MPs4, MPs5, and MPs6 coupled together in series between VccIn and another VccIn. In one embodiment, gate terminals of MPs1 and MPs4 are coupled to cp, source terminals of MPs1 and MPs4 are coupled to VccIn, and drain terminal of MPs1 is coupled to Vcp1 while drain terminal of MPs4 is coupled to Vcp2. In one embodiment, gate terminals of MPs2 and MPs5 are coupled to gp (or gp1). In one embodiment, gate terminals of MPs3 and MPs6 are coupled to Vccin/2.

In one embodiment, Vcp1 and Vcp2 are coupled to an amplifier which generates a differential output current. In one embodiment, the amplifier of $401_1$ comprises: floating current source IcsN, diode connected p-type devices MPc2 and MPc3, and common gate amplifiers MPc1 and MPc4. In one embodiment, Vcp1 is coupled to MPc1 and MPc2, while Vcp2 is coupled to MPc3 and MPc4 as shown. In one embodiment, outputs of the common gate amplifiers MPc1 and MPc3 are received by p-type current sensor receiver $403_1$ over differential interconnect $405_1$.

In one embodiment, n-type current sensor $402_1$ comprises a first stack of devices including n-type MNs1, MNs2, and MNs3 coupled together as shown, and a second stack of devices including n-type MNs4, MNs5, and MNs6 coupled together in series between ground and another ground. In one embodiment, gate terminals of MNs1 and MNs6 are coupled to cn, source terminals of MNs1 and MNs4 are coupled to ground, and drain terminal of MNs1 is coupled to Vcn1 while drain terminal of MPs4 is coupled to Vcn2. In one embodiment, gate terminals of MNs2 and MNs5 are coupled to gn (or gn1). In one embodiment, gate terminals of MNs3 and MNs6 are coupled to Vccin/2. In one embodiment, drain terminal of MNs3 is coupled to drain terminal of MPs3 and output Vxbr of bridge $101_1$.

In one embodiment, Vcn1 and Vcn2 are coupled to an amplifier which generates a differential output current. In one embodiment, amplifier of $402_1$ comprises: floating current source IcsP, diode connected n-type devices MNc2 and MNc3, and common gate amplifiers MNc1 and MNc4. In one embodiment, Vcn1 is coupled to MNc1 and MNc2, while Vcn2 is coupled to MNc3 and MNc4 as shown. In one embodiment, outputs of the common gate amplifiers MNc1 and MNc3 are received by n-type current sensor receiver $404_1$ over differential interconnect $406_1$.

In one embodiment, if both inputs Vcp1 and Vcp2 are equal, then there is no signal generated by current sensor $401_1$ for interconnect $405_1$. Vcp1 and Vcp2 may be equal when high-side switch transistors MP1 and MP2 are off. In one embodiment, if both inputs Vcn1 and Vcn2 are equal, then there is no signal generated by current sensor $402_1$ for interconnect $406_1$. Vcn1 and Vcn2 may be equal when low-side switch transistors MN1 and MN2 are off.

In one embodiment, each PMOS $401_1$ and NMOS $402_1$ current sensor senses current when its bridge device is conducting. For example, when high-side switch transistors MP1 and MP2 are conducting, PMOS current sensor $401_1$ senses current, and when low-side switch transistors MN1 and MN2 are conducting, NMOS current sensor $402_1$ senses current.

In one embodiment, when its bridge device is off, the Vxbr node is near the opposite supply rail and the current sensor goes into a defined non-sensing state to avoid sending erroneous signals as well as possible gate over-voltage stress. In one embodiment, the current sensor utilizes the bridge gate and cascode nodes to dynamically switch between sensing and non-sensing states on each half of the switching cycle. In one embodiment, for a conducting bridge, Vxbr is usually close to the supply rail. In the NMOS case (i.e., low-side switch having MN2 and MN1), Vxbr frequently goes below Vss, according to one embodiment.

In one embodiment, the current sensors $401_1$ and $401_2$ utilize a common-gate current-mode (gm) amplifier to allow accurate sensing of the bridge output node at these extreme voltages. In one embodiment, the amplifier is differential so that the output current signals can be routed long distances without being susceptible to noise interference.

Figure 6:
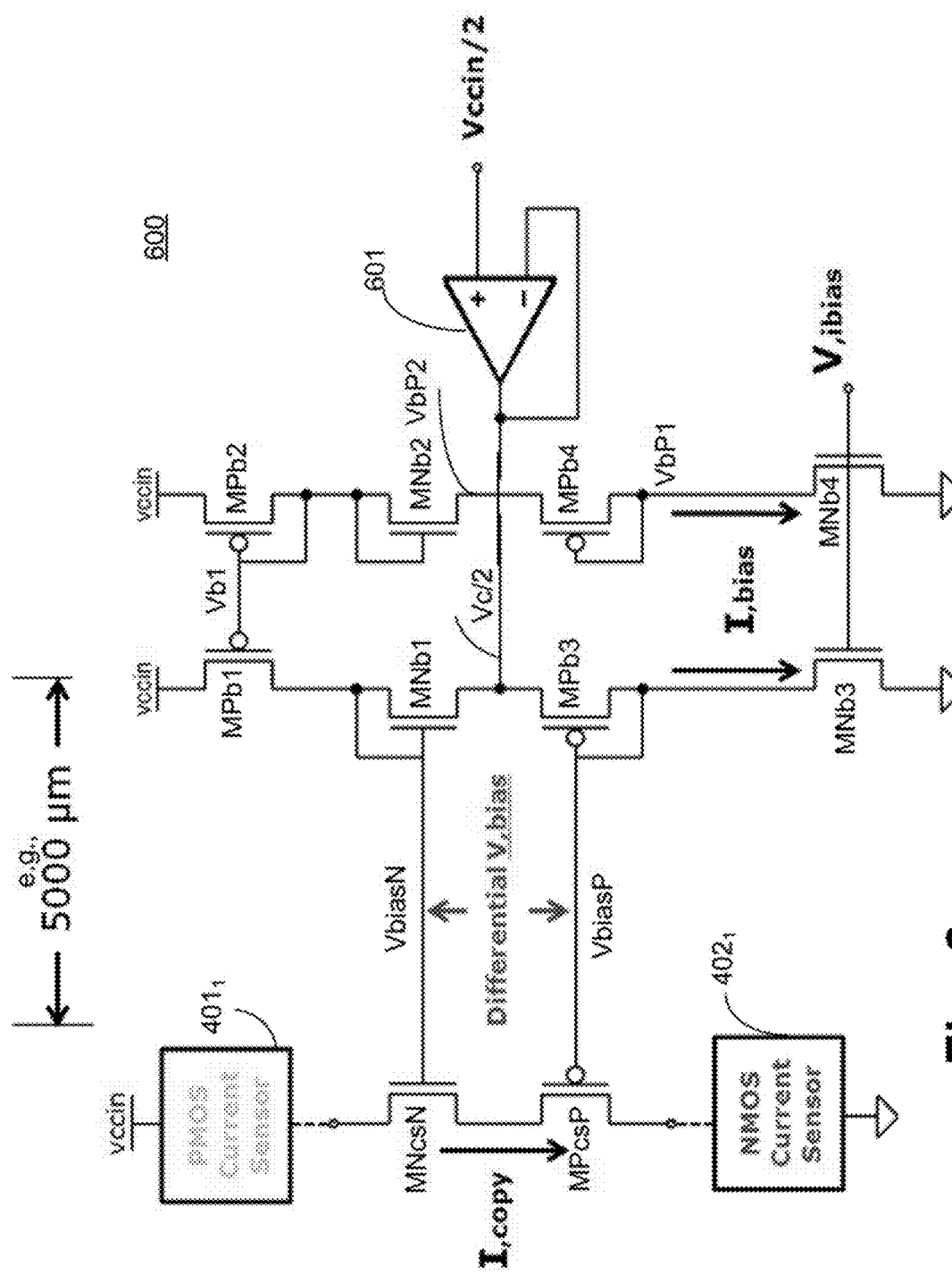
FIG. 6 illustrates differential floating current sources, according to one embodiment.

FIG. 6 illustrates differential floating current sources 600, according to one embodiment. It is pointed out that those elements of FIG. 6 having the same reference numbers (or names) as the elements of any other figure can operate or function in any manner similar to that described, but are not limited to such.

In one embodiment, differential floating current source 600 is used to supply bias current to the power train current sensors (e.g., $401_1$ and $402_1$). In one embodiment, the current sensor and the biasing circuit may be separated by a large distance e.g., 5000 μm. In one embodiment, the differential current source 600 is immune to supply droops (i.e., droops in Vccin and/or ground) because it is referenced to itself.

In one embodiment, differential floating current sources 600 comprises a differential bias network for providing VbiasN and VbiasP (i.e., differential biases) to current sources of the amplifying stage of current sensors $401_1$ and $402_1$, respectively. For each p-type and n-type current sensors, both MNcsN and MNcsP are used for the floating current source.

In one embodiment, the differential bias network comprises a unity gain amplifier 601 that receives Vccin/2 as input and generates a copy of it as Vc/2. In one embodiment, the differential bias network comprises p-type devices MPb1, MPb2, MPb3, and MPb4, and n-type devices MNb1, MNb2, MNb3, and MNb4. In one embodiment, MNb3 and MNb4 form the current source biased by V,ibias (generated by embodiment of FIG. 7). In one embodiment, Vc/2 from unity gain amplifier 601 is used to bias source terminals of MPb3 and MNb1. In one embodiment, the current drawn by MNb3 sets the voltage drop Vc/2−VbiasP. In one embodiment, the current drawn by MNb4 flows through MPb4, MNb2, and MPb2. In one embodiment, MPb2 mirrors this current to MPb1. In one embodiment, the current through MPb1 sets the voltage VbiasN−Vc/2. In such an embodiment, the sum of these voltage drops (Vc/2−VbiasP)+(VbiasN−Vc/2) is equal to VbiasN−VbiasP=V,bias.

In one embodiment, the gate nodes of the diode connected n-type and p-type devices MNb1 and MPb3 are routed to copy circuits in the p-type and n-type current sensors (e.g., $401_1$ and $402_1$) located in the various power train phases (i.e., bridges $101_{1-N}$). In this embodiment, the voltage droop problem is eliminated because the gate connections carry zero current and thus there is no IR drop on the long connecting wires.

Figure 7:
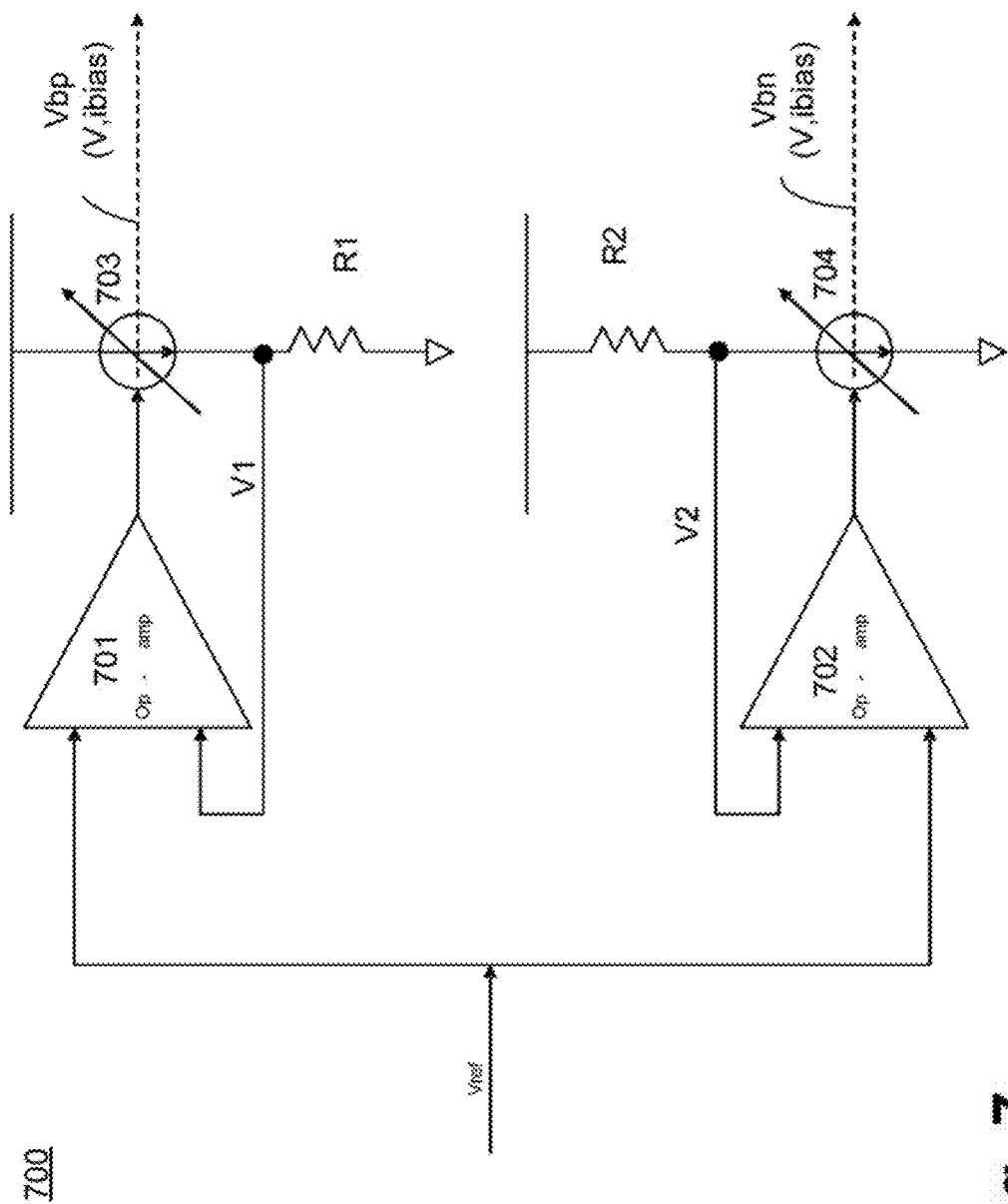
FIG. 7 is a bias circuit for the differential floating current sources, according to one embodiment of the disclosure.

FIG. 7 is a bias circuit 700 for the differential floating current sources 600, according to one embodiment of the disclosure. It is pointed out that those elements of FIG. 7 having the same reference numbers (or names) as the elements of any other figure can operate or function in any manner similar to that described, but are not limited to such.

In one embodiment, bias circuit 700 comprises amplifiers 701 and 702, adjustable current sources 703 and 704, and resistors R1 and R2. In one embodiment, bias circuit 700 receives a reference voltage (e.g., from a bandgap circuit) and generates Vbp and Vbn either of which can be used to provide V,ibias of FIG. 6. In one embodiment, adjustable current source 701 is a p-type device coupled to power supply and resistor R1. In one embodiment, resistor R1 is coupled to ground and device 703. In such an embodiment, amplifier 701 (e.g., an operational amplifier) adjusts the strength of device 703 so that V1 is substantially equal to Vref. In one embodiment, adjustable current source 702 is an n-type device coupled to ground and resistor R2. In one embodiment, resistor R2 is coupled to power supply and device 704. In such an embodiment, amplifier 702 (e.g., an operational amplifier) adjusts the strength of device 704 so that V2 is substantially equal to Vref.

In one embodiment, if 'I' is the current flowing through device 703 and resistor R1, then I=Vref/R1. In one embodiment, this current 'I' is also used for trimming or compensating offset of comparator $108_1$ as discussed with reference to FIGS. 16-18. For example, Voffset=m·I·Rmix, where 'In' is the current scaling from digital-to-analog converter (DAC) $170_1$. Substituting 'I' in the Voffset equation shows that Voffset depends on a ratio of resistors Rmix and R1, and so the impact of process variations in the resistors is substantially eliminated.

In one embodiment, bias circuit 700 produces a current such that the product of this current and the resistance of an on-die resistor is essentially constant i.e., process sensitivity is substantially reduced. In this embodiment, the current sensors' (e.g., $401_1$ and $402_1$) final output signal may depend on resistances of R1 and R2, however the offset voltage across the Rmix resistor does not depend on resistances of R1 and R2 i.e., ierr*Rmix has substantially zero process dependency.

Figures 8A, 8B:
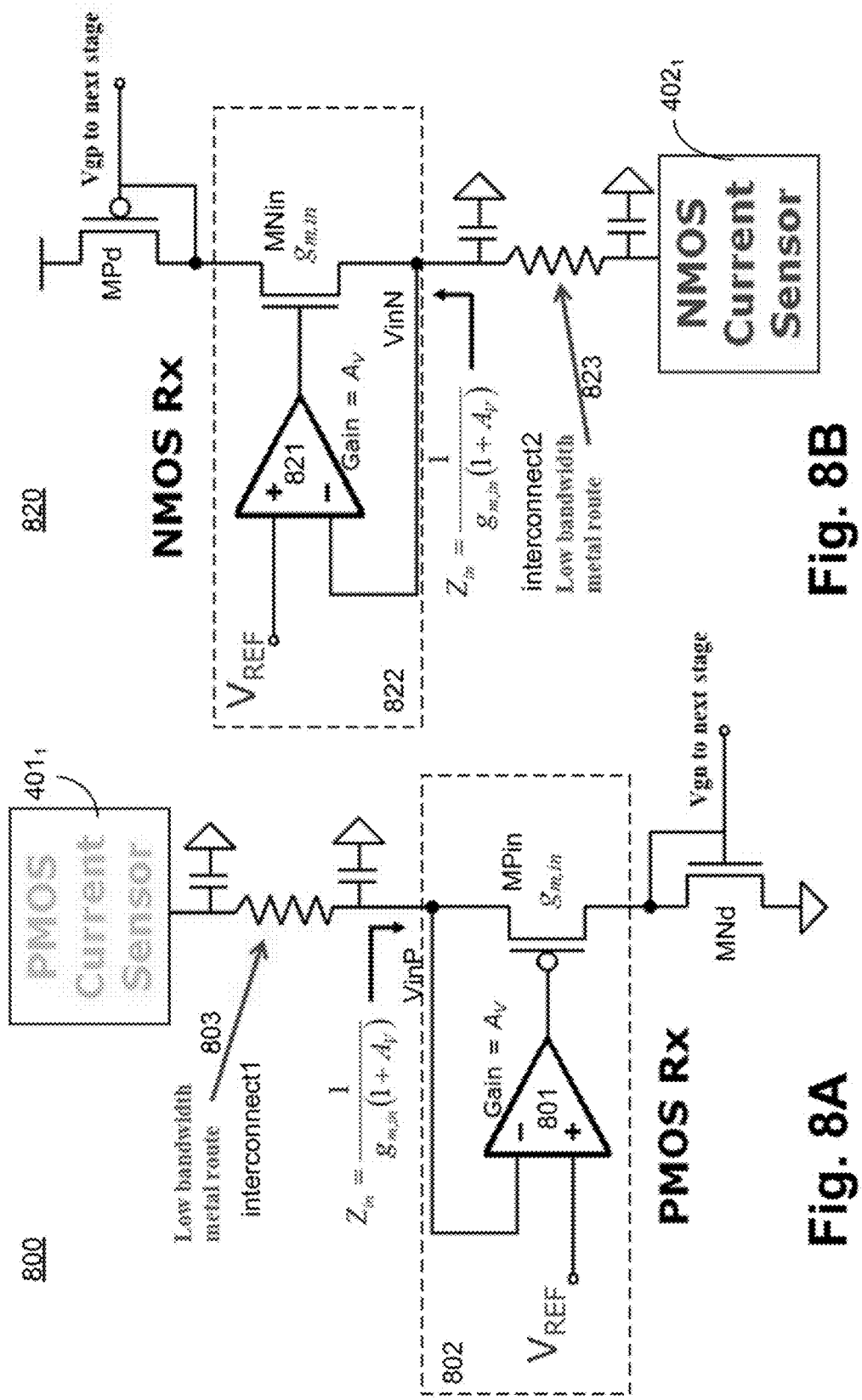
FIGS. 8A-B are low-impedance receivers for receiving differential current from the current sensors, according to one embodiment of the disclosure.

FIGS. 8A-B are low-impedance receiver architectures 800 and 820, respectively, for receiving differential current from current sensors (e.g., $401_1$ and $402_1$), according to one embodiment of the disclosure. It is pointed out that those elements of FIGS. 8A-B having the same reference numbers (or names) as the elements of any other figure can operate or function in any manner similar to that described, but are not limited to such.

In one embodiment, low-impedance receiver architecture 800 comprises receiver 802 and diode connected n-type device MNd. In one embodiment, receiver 802 receives current from p-type current sensor (e.g., $401_1$) through its low-impedance input. So as not to obscure the embodiment, differential output of p-type current sensor $401_1$ is not shown. In one embodiment, current from p-type current sensor $401_1$ flows through a long interconnect $405_1$ modeled as a PI-network 803 of capacitors and resistor coupling p-type current sensor $401_1$ and low-impedance receiver 802.

In one embodiment, low-impedance receiver 802 comprises an amplifier 801 and p-type device MPin. In one embodiment, input VinP of low-impedance receiver 802 is coupled to MPin and input of amplifier 801. In one embodiment, amplifier 801 also receives a reference voltage $V_{REF}$ and adjusts the strength of MPin to cause VinP to be substantially equal to $V_{REF}$. In one embodiment, the current through MPin flows through diode connected MNd, and a voltage Vgn proportional to this current is generated.

In one embodiment, low-impedance receiver architecture 820 comprises receiver 822 and diode connected p-type device MPd. In one embodiment, receiver 822 receives current from n-type current sensor (e.g., $402_1$) though its low-impedance input. So as not to obscure the embodiment, differential output of n-type current sensor $402_1$ is not shown. In one embodiment, current from n-type current sensor $402_1$ flows through a long interconnect $406_1$ modeled as a PI-network 823 of capacitors and resistor coupling n-type current sensor $402_1$ and low-impedance receiver 822.

In one embodiment, low-impedance receiver 822 comprises an amplifier 821 and n-type device MNin. In one embodiment, input VinN of low-impedance receiver 822 is coupled to MNin and input of amplifier 821. In one embodiment, amplifier 821 also receives a reference voltage $V_{REF}$ and adjusts the strength of MNin to cause VinN to be substantially equal to $V_{REF}$. In one embodiment, the current through MNin flows through diode connected MPd, and a voltage Vgp proportional to this current is generated.

In this embodiment, low-impedance inputs are used to receive the power train current sensor differential current-mode signals. Low-impedance input is used because the long routes (e.g., 5000 µm) from the power train (e.g., bridge $101_1$) to the receiver 802 (and 822) would cause the bandwidth to be very poor unless the voltage swing at the termination of the routes is kept to a minimum. In one embodiment, the low-impedance input VinP (and VinN) is created by inserting a gain-boosted pass transistor MPin (and MNin) between the long routes $405_1$ (i.e., 803) and the diode connected device MNd (and MPd) that is mirrored to the next stage.

In one embodiment, the input impedance of the pass transistor MPin, nominally 1/gm, is boosted by a factor of $1+A_v$, where $A_v$ is the gain of amplifier 801. In one embodiment, amplifier 801 (and 821) is a single-stage differential pair with a gain of around 30 dB. In such an embodiment, amplifier 801 (and 821) has only a single stage in order to eliminate the possibility of instability. In other embodiments, other designs and number of stages for amplifier 801 (and 821) may be used.

Figure 9:
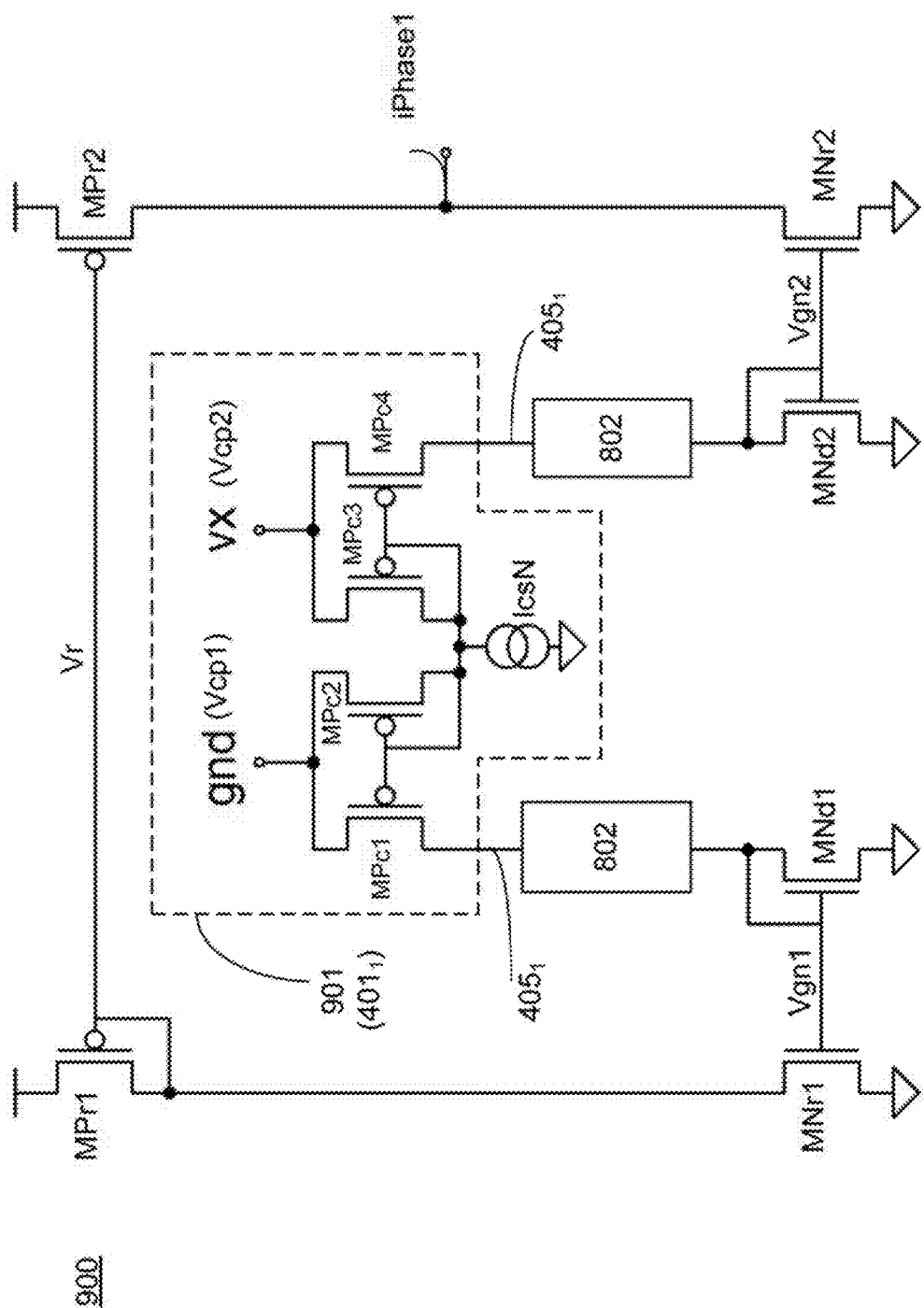
FIG. 9 is a circuit with receiver circuit a p-type current sensor, according to one embodiment of the disclosure.

FIG. 9 is a circuit 900 with receiver circuit (e.g., $403_1$) and p-type current sensor (e.g., $401_1$), according to one embodiment of the disclosure. It is pointed out that those elements of FIG. 9 having the same reference numbers (or names) as the elements of any other figure can operate or function in any manner similar to that described, but are not limited to such.

In one embodiment, circuit 900 with receiver circuit (e.g., $403_1$) is coupled to current sensor (e.g., $401_1$). In one embodiment, circuit 900 comprises two branches to couple to the differential outputs of current sensor 901 (e.g., $401_1$). The first branch includes MNr1 and diode connected MPr1, and the second branch includes MPr2 and MNr2. In one embodiment, first output current of current sensor 901 is received by receiver 802 via interconnect1 $405_1$ and is converted into a voltage Vgn1 via diode connected MNd1 (same as MNd of FIG. 8A). In this embodiment, MPr1 and MPr2 form current mirrors and are biased by Vr at their gate terminals.

In one embodiment, current through MNd1 is mirrored to the second branch (having MPr2 and MNr2) via n-type devices MNr1 and diode connected MPH. In one embodiment, second output current of current sensor is received by receiver 802 via interconnect1 $405_1$ and is converted into a voltage Vgn2 via diode connected MNd2 (same as MNd of FIG. 8A). In this embodiment, differential current from sensor 901 is converted into single-ended current iPhase1 (associated with bridge $101_1$).

In one embodiment, a filtered, unregulated voltage supply is used to power the current sensor receiver 900. The use for higher voltage stems from a voltage drop created by NMOS current signals on the long routes (e.g., $405_1$) between the power train (e.g., $101_1$) and receiver 900 (e.g., $403_1$). This voltage drop reduces the headroom to a point that a supply of at least 1.2V is may be used for stable operation.

In one embodiment, the current sensor receiver cannot be supplied directly by the Vccin rail because large high-frequency noise may disrupt the differential-to-single ended output stage of the current sensor. In one embodiment, an RC low-pass filter is applied to the gate of an NMOS power transistor whose drain is connected to Vccin and whose source supplies the current sensor receiver circuit. In one embodiment, the RC low-pass filter filters high frequency noise from Vccin without requiring an additional linear regulator. In one embodiment, the new supply Vcccsrcvr (provided to source terminals of MPr1 and MPr2) is unregulated at DC, and its value is Vccin-Vt,n.

In one embodiment, pair of pass devices (i.e., MPc1 and MPc2, and MPc3, and MPc4 in the PMOS current sensor 901, controlled by an override signal, allow current sensor 901 to operate without the PMOS cascode turning on. In this embodiment, the current sensor's output consists of a first-order error signal (compound offset), which is used to calibrate the current sensor to 'zero.' For example, when power FET of bridge 101₁ is turned off, the current sensor associated with that power FET does not measure current i.e., the inputs of the current sensor are shorted together. In this example, phase current sensor's output is just an error current (e.g., due to process variation). This error (or offset) current is calibrated out during PWM Trim calibration process, according to one embodiment. In one embodiment, receiver circuit 403₁ (i.e., remainder of 900 after taking out 901) which receives the differential current signal from the current sensor 901, converts it into a single-ended current signal iPhase1. In one embodiment, the receiver makes several copies of this signal iPhase1 with either sign (positive or negative). In one embodiment, copies of this signal iPhase from several phases can be added to produce a sum or average current sensor signal for an entire voltage domain or for several domains.

Figure 10:
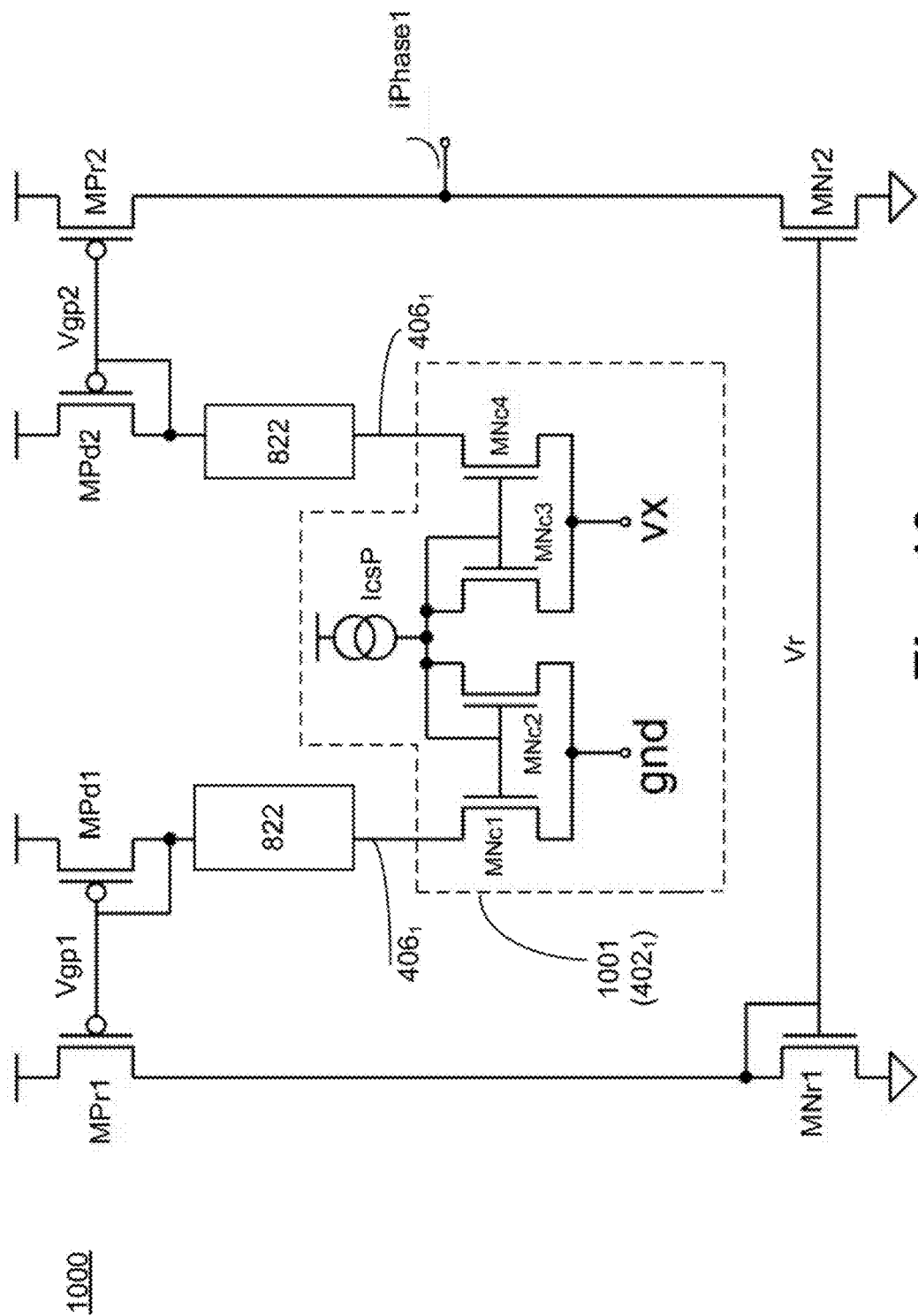
FIG. 10 is a circuit with receiver circuit and an n-type current sensor, according to one embodiment of the disclosure.

FIG. 10 is a circuit 1000 with receiver circuit (e.g., 404₁) and n-type current sensor (e.g., 402₁), according to one embodiment of the disclosure. It is pointed out that those elements of FIG. 10 having the same reference numbers (or names) as the elements of any other figure can operate or function in any manner similar to that described, but are not limited to such.

In one embodiment, circuit 1000 with receiver circuit (e.g., 404₁) coupled current sensor (e.g., 402₁). In one embodiment, circuit 1000 comprises two branches to couple to the differential outputs of current sensor 1001 (e.g., 402₁). The first branch includes MPr1 and diode connected MNr1, and the second branch includes MNr2 and MPr2. In one embodiment, first output current of current sensor 1001 is received by receiver 822 via interconnect2 406₁ and is converted into a voltage Vgp1 via diode connected MPd1 (same as MPd of FIG. 8B). In this embodiment, MNr1 and MNr2 form current mirrors and are biased by Vr at their gate terminals.

In one embodiment, current through MNd1 is mirrored to the second branch (having MNr2 and MPr2) via p-type devices MPr1 and diode connected MNr1. In one embodiment, second output current of current sensor is received by receiver 822 via interconnect2 406₁ and is converted into a voltage Vgp2 via diode connected MPd2 (same as MPd of FIG. 8B). In this embodiment, differential current from sensor 1001 is converted into single-ended current iPhase1 (associated with bridge 101₁). In one embodiment, a filtered, unregulated voltage supply is used to power the current sensor receiver 1000 as described with reference to embodiment of FIG. 9.

In one embodiment, a resistor (not shown) is connected to one or more receiver outputs such that the resistor's voltage change is proportional to the change of the sum of the receivers' output currents. In such an embodiment, the resistor voltage change can be proportional to a phase current, a domain current, or to the VR input current (i.e., if only the high-side switch current is actually used). In one embodiment, the resistance of this resistor is programmable. In one embodiment, the resistor can be biased from a voltage divider, typically around ½ of the analog supply, so that the current sensor can accurately sense currents around zero without voltage headroom issues that cause non-linearity.

Figure 11:
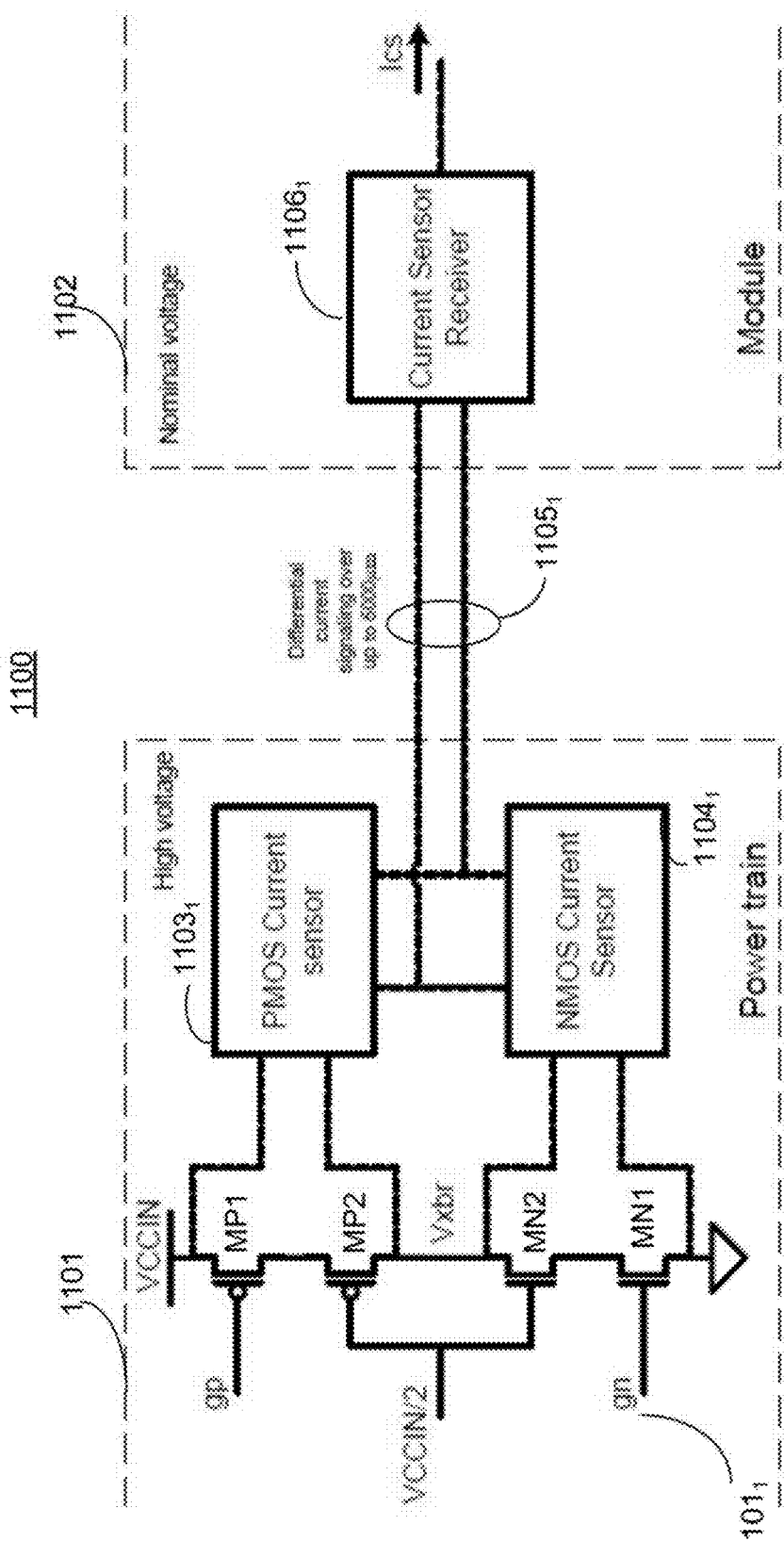
FIG. 11 is a part circuit of a voltage regulator with n-type and p-type current sensors, according to another embodiment of the disclosure.

FIG. 11 is a part circuit 1100 of a VR with n-type and p-type current sensors, according to another embodiment of the disclosure. It is pointed out that those elements of FIG. 11 having the same reference numbers (or names) as the elements of any other figure can operate or function in any manner similar to that described, but are not limited to such.

Circuit 1100 illustrates a power train bridge 1101 and a receiver module 1102 having receiver 1106₁. The embodiment of FIG. 11 is similar to the embodiment of FIG. 4. However, in the embodiment of FIG. 11, one set of differential currents via interconnect 1105₁ for both p-type and n-type current sensors (1103₁ and 1104₁, respectively) is used to provide current to current sensor receiver 1106₁. In this embodiment, no or substantially zero DC current passes through 1105₁, as a result dynamic range for sensing current is preserved. Here, the term "preserved" generally refers to not losing headroom since there is no (or substantially zero) IR drop on 1105. In such an embodiment, power savings are realized over the embodiment of FIG. 4 because p-type and n-type current sensors share a single bias current rather than consuming two separate currents.

In this embodiment, instead of sending n-type and p-type sensor signals separately (as described with reference to FIG. 4) over 405₁ and 406₁, they are combined together at the power train 1101. In such an embodiment, routing resources are saved and integration complexity is reduced. In one embodiment, current sensor receiver 1106₁ operates from a nominal analog quiet power supply instead of Vccsrcvr.

A simple sum of all phase currents (i.e., iPhase(1-N)) may not represent average signal correctly, when some phases are not active. It may cause phase balancing loop gain variations with number of active phases, reducing the efficacy of the phase current balancing loop. In addition it may cause inaccurate over-current protection (OCP) at any number of active phases except for some phases (e.g., 4, 8 and 16, for 16 phase VR), whereas it may be desirable to have a reliable over-current protection for a broad range of active phases.

There are several technical effects of the embodiment of FIG. 11. Compared to the area used by the current sensor receivers 403₁ and 404₁, the area of current sensor receiver 1104₁ is halved; the number of long analog routes is halved; high voltage analog supply is not longer used; power loss during shutdown is significantly reduced; constant gain over phase activation range is preserved; OCP is accurate for any number of active phases, etc.

Figure 12:
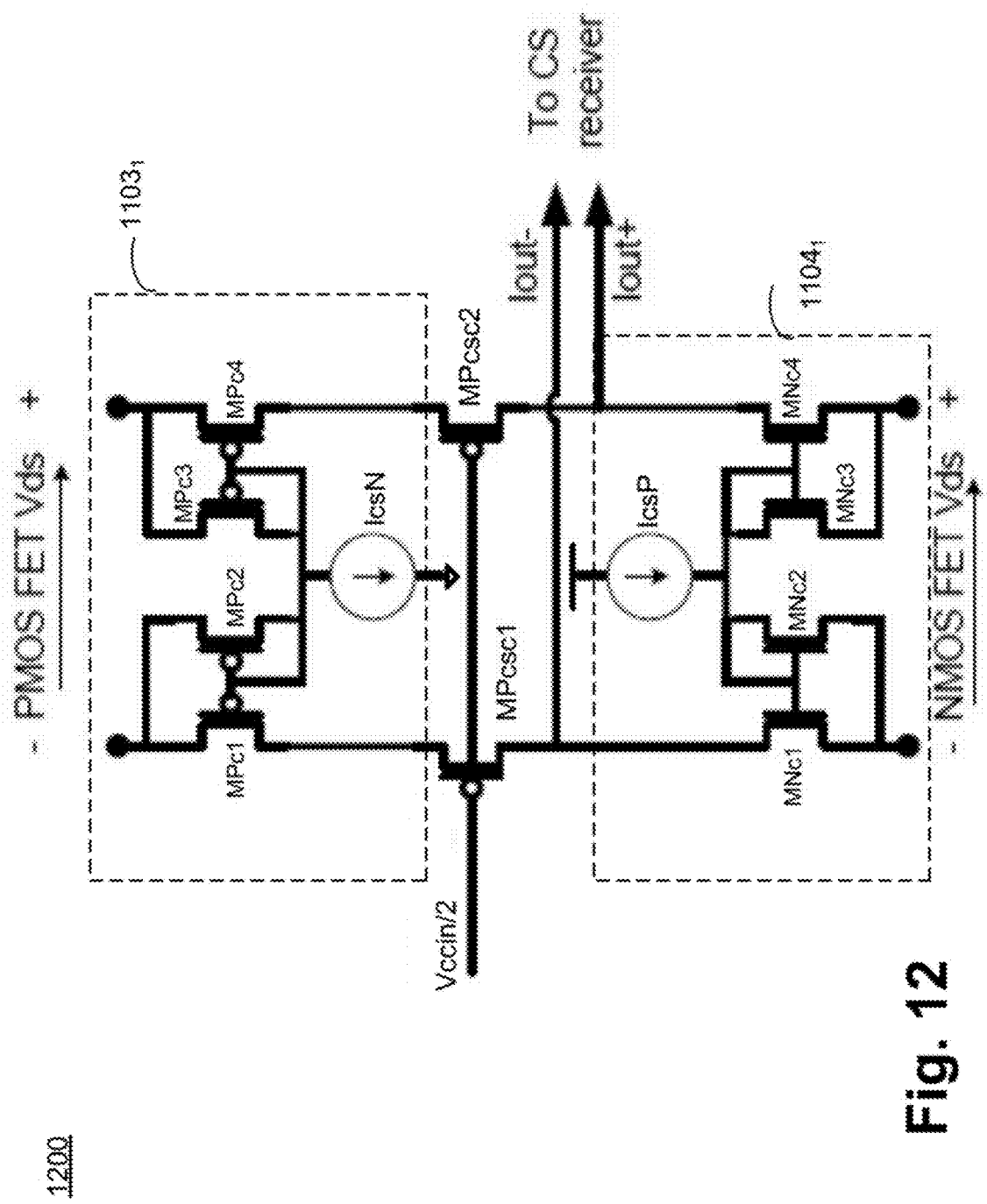
FIG. 12 is a transistor level architecture of n-type and p-type current sensors, according to another embodiment of the disclosure.

FIG. 12 is a transistor level architecture 1200 of n-type and p-type current sensors, according to another embodiment of the disclosure. It is pointed out that those elements of FIG. 12 having the same reference numbers (or names) as the elements of any other figure can operate or function in any manner similar to that described, but are not limited to such.

In one embodiment, output signals of n-type and p-type sensors (1103$_1$ and 1104$_1$) are combined by transistors MPcsc1 and MPcsc2 in such a way that each sensor acts as an active load of the other. In one embodiment, MPcsc1 and MPcsc2 are biased by Vccin/2. In one embodiment, with proper biasing, quiescent currents in both sensors (1103$_1$ and 1104$_1$) are kept substantially equal and the actual signal current is sent over to the receiver 1106$_1$. In one embodiment, only offset DC currents travels across the large distances of 1105$_1$. This relaxes wire reliability requirements and reduces IR drop related headroom issues. In one embodiment, each sensor can be operated separately. In such an embodiment, the other sensor becomes a DC current source by shorting its inputs together. For example, when one of the current sensors is active, then the other current sensor which is inactive behaves as a current source and provides an operating point to the active current sensor.

Figure 13:
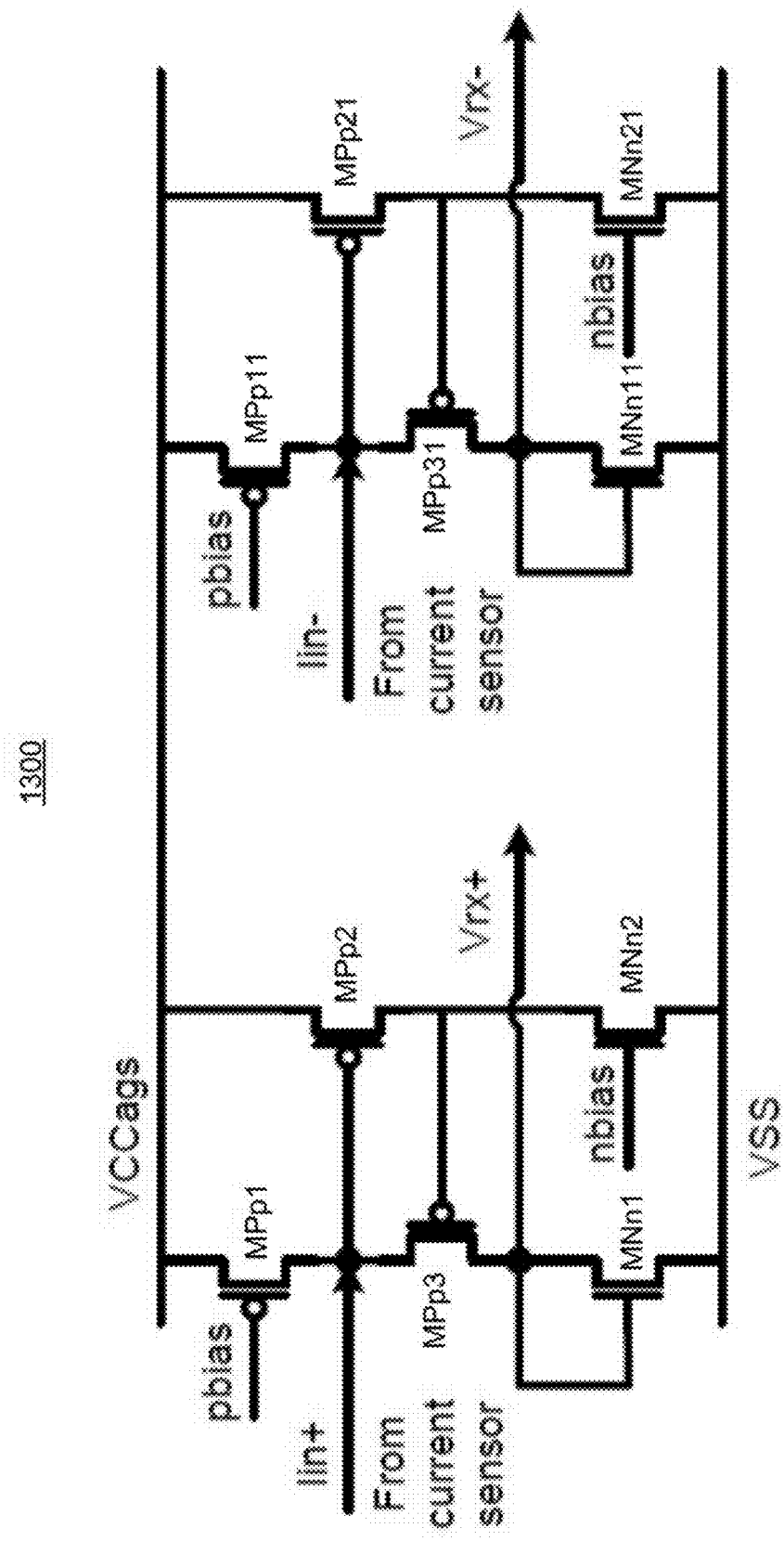
FIG. 13 is a current sensor receiver circuit, according to one embodiment of the disclosure.

FIG. 13 is a current sensor receiver circuit 1300 (e.g., 1106$_1$), according to one embodiment of the disclosure. It is pointed out that those elements of FIG. 13 having the same reference numbers (or names) as the elements of any other figure can operate or function in any manner similar to that described, but are not limited to such.

In one embodiment, current sensor receiver circuit 1300 comprises low-impedance input stages for receiving currents Iin+ and Iin− from current sensors 1103$_1$ and 1104$_1$ over differential interconnect 1105$_1$. In one embodiment, the low-impedance stage to the left comprises p-type devices MPp1, MPp2, and MPp3, and n-type devices MNn1 and MNn2. In one embodiment, MPp1 is biased by pbias and MMn2 is biased by nbias. In one embodiment, pbias and nbias can be generated by any known reference generator. For example, pbias and nbias can be generated using bias circuit 700 of FIG. 7. Referring back to FIG. 13, in one embodiment, output of the low-impedance stage is Vrx+.

In one embodiment, the low-impedance stage to the right comprises p-type devices MPp11, MPp21, and MPp31, and n-type devices MNn11 and MNn21. In one embodiment, MPp11 is biased by pbias and MNn21 is biased by nbias. In one embodiment, output of the low-impedance stage is Vrx−.

In the embodiments of FIGS. 11-13, lower number of current sensor receivers and a compact receiver implementation reduces power consumption in functional mode. In one embodiment, voltage at input of receiver 1300 is regulated at Vgs below the supply voltage. This allows using nominal voltage analog supply for the receiver and eliminating the use of high voltage power supply Vccsrcvr. This change leads to a significant reduction of leakage power during the shutdown.

Figure 14:
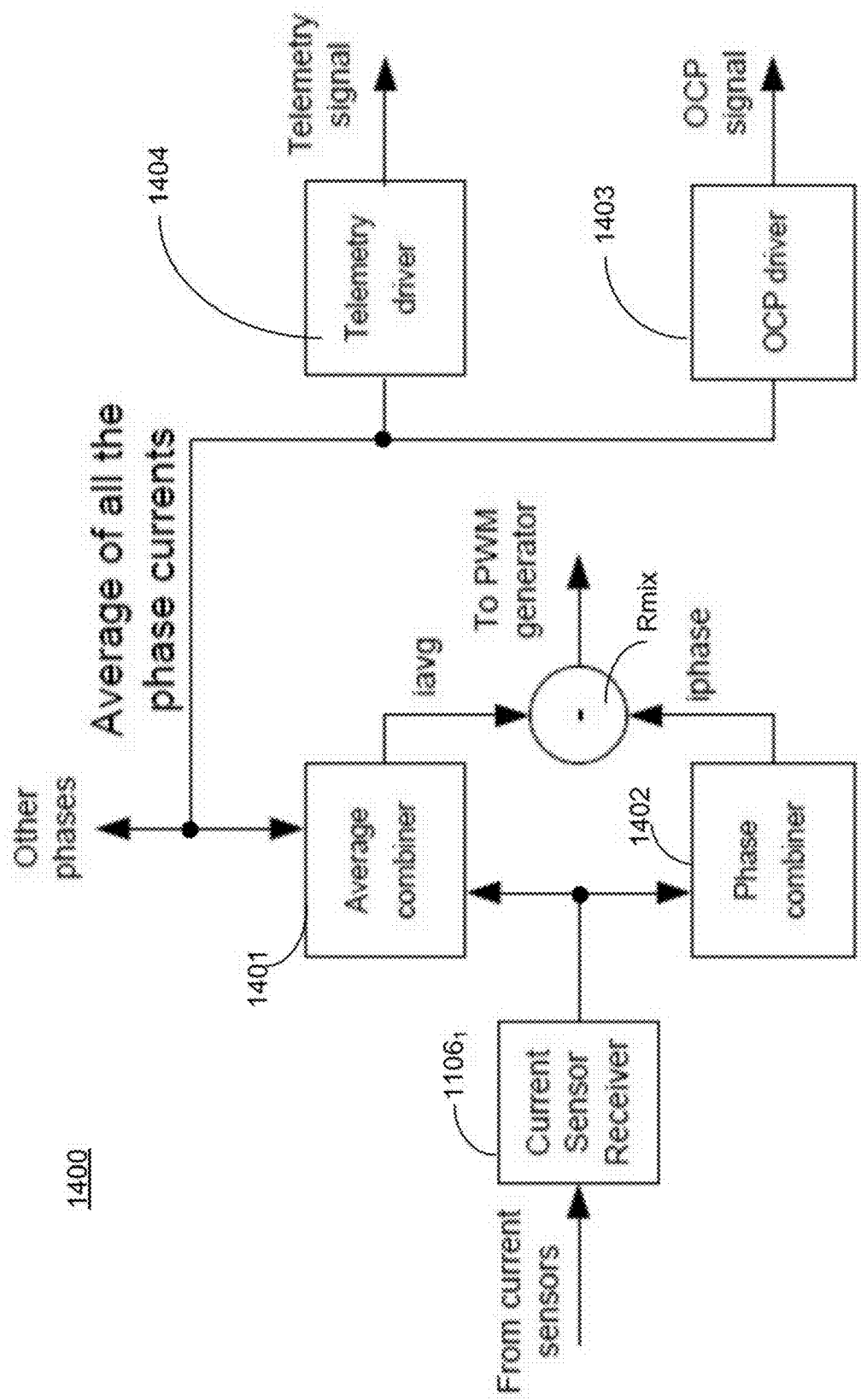
FIG. 14 is a high level architecture of voltage regulator current sensors with telemetry and over-current protection drivers, according to one embodiment of the disclosure.

FIG. 14 is a high level architecture 1400 of VR current sensors with telemetry and over-current protection drivers, according to one embodiment of the disclosure. It is pointed out that those elements of FIG. 14 having the same reference numbers (or names) as the elements of any other figure can operate or function in any manner similar to that described, but are not limited to such.

In one embodiment, architecture 1400 comprises average combiner 1401, phase combiner 1402, over-current protection (OCP) driver 1403, telemetry driver 1404, Rmix (current mixer), and current sensor receiver 1106$_1$. In one embodiment, average combiner 1401 receives phase currents from all phases (iPhase(1-N) and generates iavg current. In one embodiment, the iavg current is subtracted from iPhase current (e.g., iPhase1) by current mixer Rmix (e.g., 107$_1$) to generate an ierr current used to provide DC voltage shift to the triangular wave for the PWM comparator (e.g., 108$_1$).

In one embodiment, average of all phase currents from all phases (i.e., bridges) is received by telemetry driver 1404 for other uses. For example, telemetry signal may be used during high-volume manufacturing (HVM) for monitoring a performance parameter. In one embodiment, average of all phase currents from all phases is received by OCP driver 1403 to generate OCP signal. For example, if OCP signal indicates that iavg is above a threshold then the entire processor and/or system or sub-system may be shut down.

Accurate average current information is useful for current balancing, telemetry, and over-current protection. iavg signal allows maintaining constant phase signal and therefore constant balancing loop gain over the entire phase activation range. Current signal is actively collected by receiver 1106$_1$, translated to voltage and sent over to average and phase combiners 1401 and 1402, respectively. In one embodiment, phase combiner 1402 generates single-ended phase current signal. In one embodiment, average combiner 1401 combines all the phase currents together in such a way that mismatch currents are averaged out and average NMOS and PMOS Vgs voltages are generated.

Figure 15:
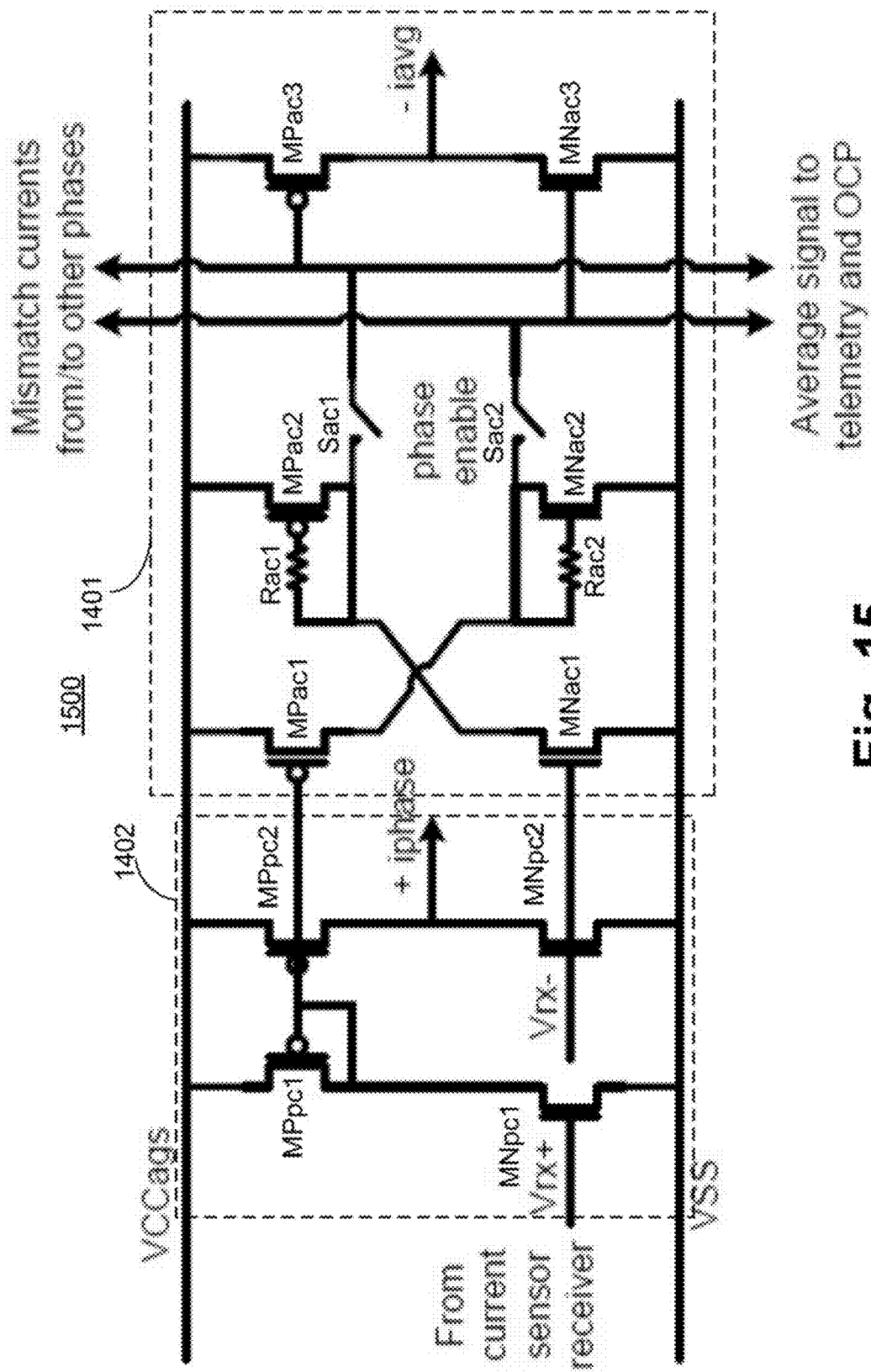
FIG. 15 is a circuit for phase current averaging, according to one embodiment of the disclosure.

FIG. 15 is a circuit 1500 for phase current averaging, according to one embodiment of the disclosure. It is pointed out that those elements of FIG. 15 having the same reference numbers (or names) as the elements of any other figure can operate or function in any manner similar to that described, but are not limited to such.

In one embodiment, circuit 1500 comprises phase combiner 1402 and average combiner 1401 coupled together to provide iPhase and iavg signals. In one embodiment, phase combiner 1402 comprises p-type devices MPpc1 (diode connected), MPpc2, and n-type devices MNpc1 and MNpc2. In one embodiment, Vrx+ and Vrx− are received from current sensor receiver 1106$_1$ and corresponding iPhase is generated which is proportional to Vrx+ and Vrx−.

In one embodiment, average combiner 1401 comprises p-type devices MPac1, MPac2, MPac3, n-type devices MNac1, MNac2, and MNac3, switches Sac1, Sac2, and resistors Rac1 and Rac2. In one embodiment, MPac2 and MNac2 are diode connected devices. In one embodiment, switches Sac1 and Sac2 are phase enable signals which also to combine phase currents of different phases. In this embodiment, every phase drives current into diode connected devices MPac2 and MNac2, and the diode connected devices MPac2 and MNac2 are shorted to get average current (iavg). In one embodiment, devices MPac3 and MNac3 combine the currents to form iavg. In one embodiment, Mpac1 and MNac1 drive the current for the phase's contribution to the average signal. In one embodiment, when MPac1 and MNac1 are coupled to the rest of the phases by Sac1 and Sac2, they contribute to the average current. In one embodiment, when t MPac1 and MNac1 are de-coupled, they still may drive current into MNac2 and MPac2, but the resulting signal is not added to the total average current. In one embodiment, resistors Rac1 and Rac2 create a low-pass filter which smoothes out the ripple and make the average current signal appear constant over the time frame of a switching period.

Figure 16:
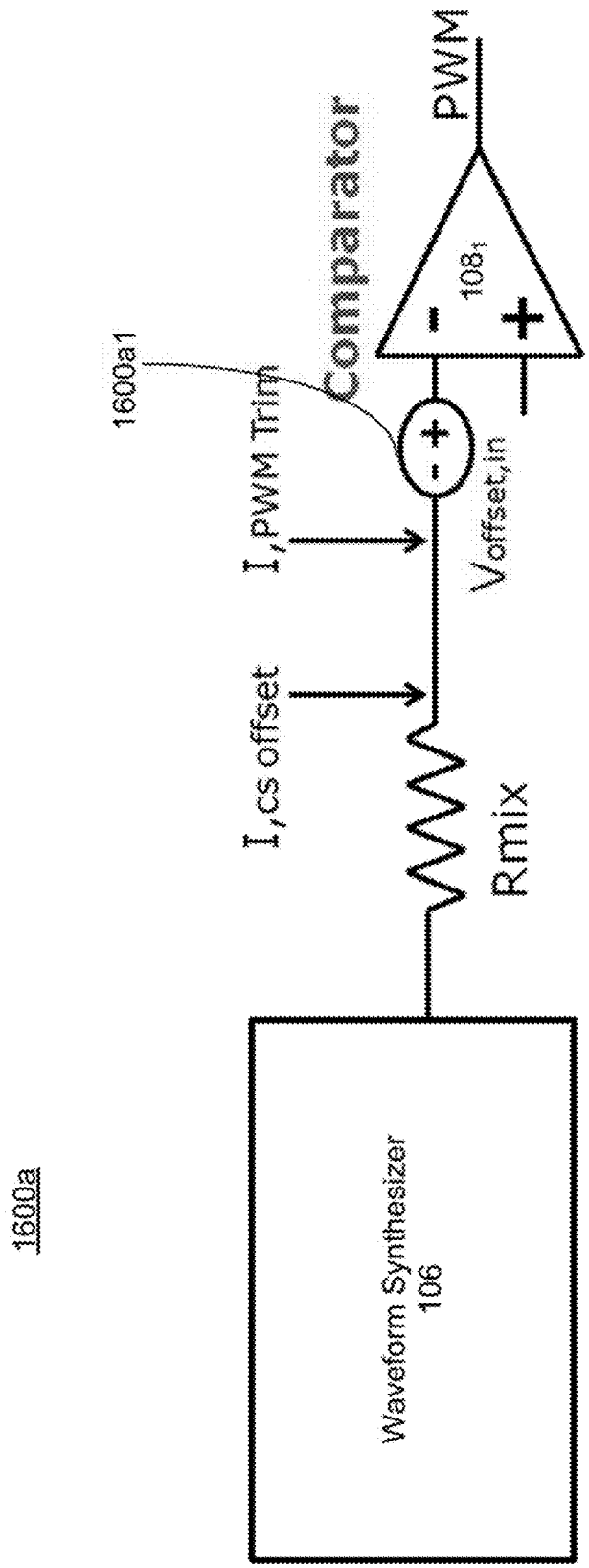
FIG. 16 is a phase balancing circuit with offset control, according to one embodiment of the disclosure.

FIG. 16 is a phase balancing circuit 1600a with offset control, according to one embodiment of the disclosure. It is pointed out that those elements of FIG. 16 having the same reference numbers (or names) as the elements of any other figure can operate or function in any manner similar to that described, but are not limited to such. FIG. 16 is similar to the embodiment of FIG. 2 except that voltage offset (Voffset) is added or subtracted for the input coupled to comparator $108_1$.

One of the contributors to static phase current imbalance is the inherent input offset of the PWM comparators $108_{1-N}$ and the output offset of the current sensors themselves. In order to reduce this offset as much as possible, in one embodiment, a trimming mechanism called PWM Trim is added to the mixer resistor Rmix of each phase alongside the current sensors. In one embodiment, the PWM trim (discussed with reference to FIG. 17) injects current $I_{,PWMTrim}$ into the mixer resistor with the magnitude $I_{,PWMTrim} = -(I_{,csoofset} + V_{offset,in}/R_{mix})$ to cancel any offset in comparator $108_1$ and current sensor offset current. In one embodiment, $I_{,csoffset}$ is the output offset inherent to the current sensor itself. In one embodiment, $I_{,PWMTrim}$ is the current injected to cancel this offset and the input offset of comparator $108_1$. In one embodiment, both p-type and n-type current sensors have their inputs shorted during PWM trimming process.

Figure 17:
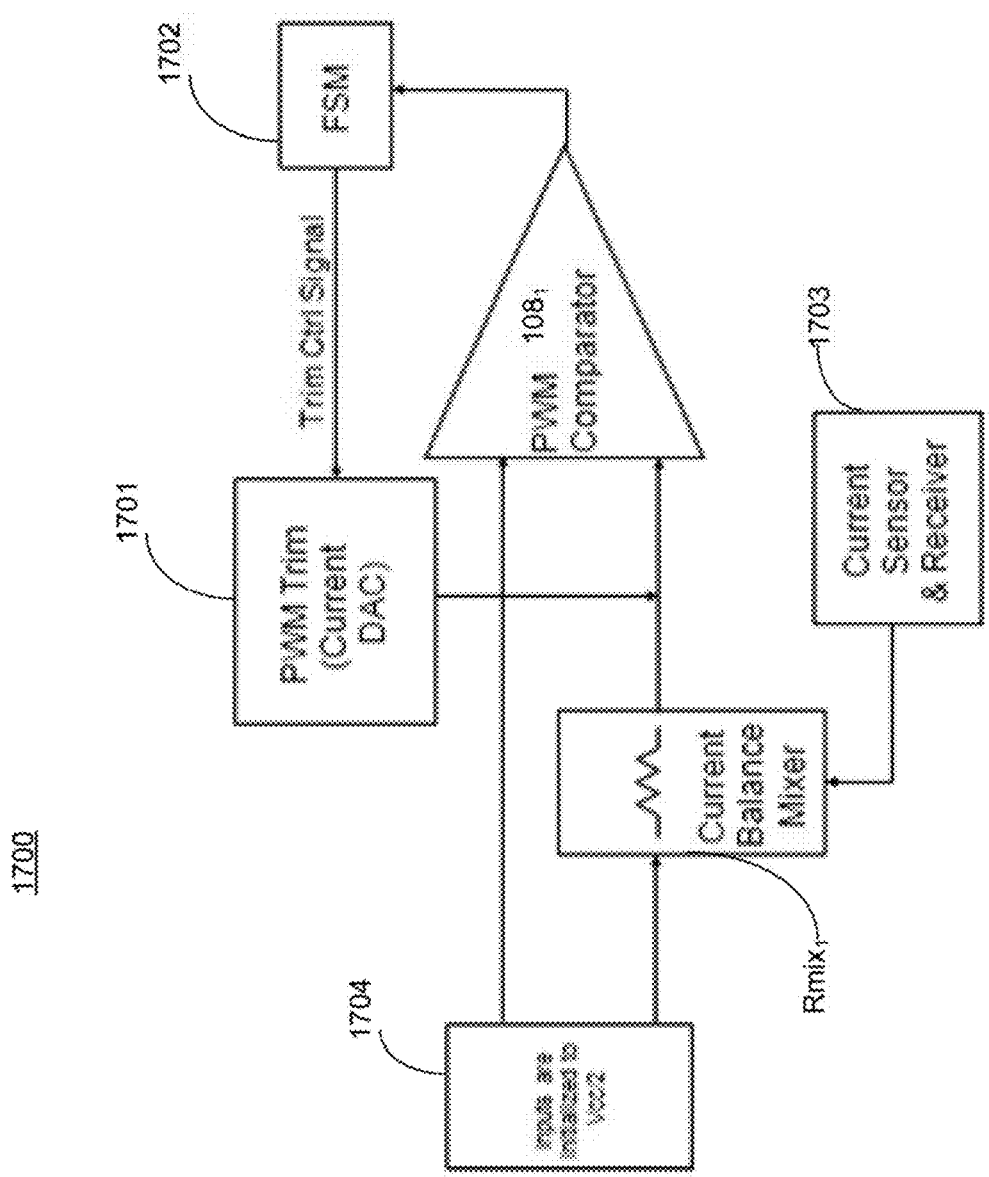
FIG. 17 is a high level architecture for offset cancellation of a comparator and current sensor mismatch, according to one embodiment of the disclosure.

FIG. 17 is a high level architecture 1700 for offset cancellation of a comparator and current sensor mismatch, according to one embodiment of the disclosure. It is pointed out that those elements of FIG. 17 having the same reference numbers (or names) as the elements of any other figure can operate or function in any manner similar to that described, but are not limited to such.

In one embodiment, architecture 1700 comprises a PWM current trim digital-to-analog converter (DAC) $170_1$; a finite state machine (FSM) 1702, PWM comparator $108_1$, current sensor and receiver 1703, current balance mixer Rmix1 (e.g., $107_1$), and circuit 1704 to provide inputs to comparator $108_1$. In one embodiment, for each phase, an independent architecture 1700 is used. In one embodiment, architecture 1700 is shared with all phases. In such an embodiment, it is assumed that each PWM comparator from among comparators $108_{1-N}$ have the same offset.

In one embodiment, architecture 1700 makes use of a negative feedback loop to minimize possible offset through continuous calibration. In one embodiment, the loop includes DAC 1701, which either sources or sinks current through a resistor to compensate the offset. In one embodiment, the comparison result through comparator $108_1$ directs the FSM 1702 to control DAC 1701. This forms a loop that trims out the offset to 0 (or substantially zero) or a value less than a LSB (least significant bit) of the DAC 1701.

In one embodiment, first the PMW trim FSM 1702 sets the wave synthesizer 106 (shown here as circuit 1704) to a constant DC value and also connects the positive input of comparator $108_1$ to this DC source. In one embodiment, the trim FSM 1702 sets $I_{,PWMTrim}$ to its most negative value via DAC 1701 and checks the output of comparator $108_1$. In one embodiment, if the output of comparator $108_1$ is high, FSM 1702 increments $I_{,PWMTrim}$ via DAC 1701 and checks the output of comparator $108_1$ again. In one embodiment, FSM 1702 does this process until the output of comparator $108_1$ switches low. At such a point, the offsets have been cancelled to within one LSB (least significant bit) of the trim accuracy and FSM 1702 stops cycling and holds $I_{,PWMTrim}$ at its last value.

Figure 18:
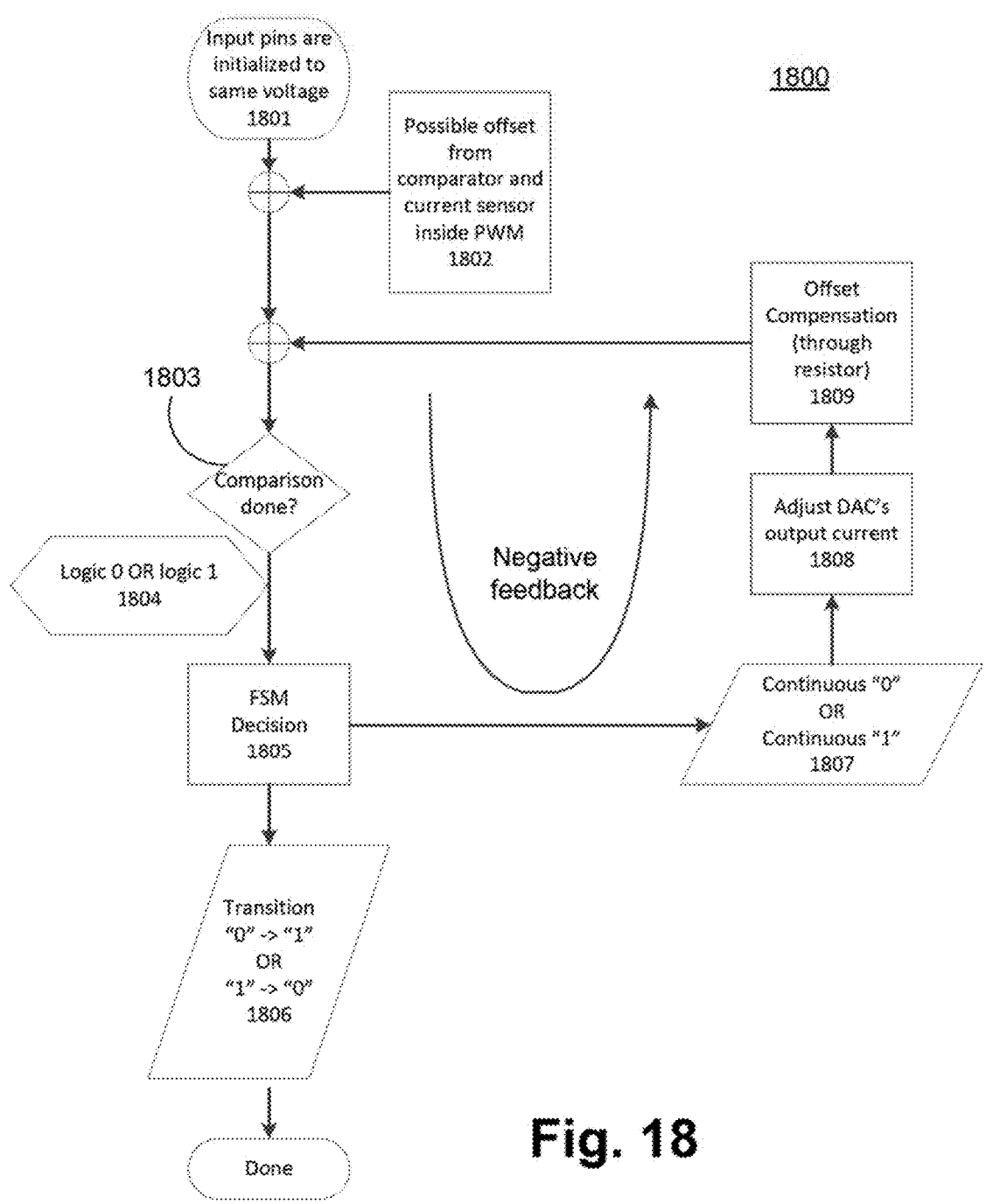
FIG. 18 is a method flowchart for offset cancellation of a comparator and current sensor mismatch, according to one embodiment of the disclosure.

FIG. 18 is a method flowchart 1800 for offset cancellation of a comparator and current sensor mismatch, according to one embodiment of the disclosure.

Although the blocks in the flowcharts with reference to FIG. 18 are shown in a particular order, the order of the actions can be modified. Thus, the illustrated embodiments can be performed in a different order, and some actions/blocks may be performed in parallel. Some of the blocks and/or operations listed in FIG. 18 are optional in accordance with certain embodiments. The numbering of the blocks presented is for the sake of clarity and is not intended to prescribe an order of operations in which the various blocks must occur. Additionally, operations from the various flows may be utilized in a variety of combinations.

In one embodiment, the input pins of comparator $108_1$ are initialized to the same voltage (Vcc/2) when the calibration starts. In one embodiment, any possible offset is amplified and forces the comparator's output to either Vcc or Vss. In one embodiment, FSM 1702 continuously monitors the result of comparator output and adjusts the DAC's setting in a way to reduce the offset. This process continues until the comparator's output is flipped, which indicates the end of calibration. In one embodiment, the final offset is less than 1 LSB of the DAC 1701.

At block 1801, inputs of comparator $108_1$ are initialized by circuit 1704 to same voltage (e.g., Vcc/2). Block 1802 indicates the possible offset from comparator $108_1$ and current sensor 1702 inside PWM 102. At block 1803, FSM 1702 compares output of comparator $108_1$ with its previous state, which is indicated by block 1804. At block 1805, FSM 1702 determines whether the output of comparator $108_1$ has transitioned or remains the same. In one embodiment, output of comparator $108_1$ directs the method flow. For example, assuming the range of the PWM DAC 1701 is larger than a maximum possible offset, then at the largest negative trim current, comparator $108_1$ output is high. In this example, at the largest positive trim current, comparator $108_1$ output is low.

At block 1806, if FSM 1702 determines that output of comparator $108_1$ has transitioned (either from '0' to '1' or '1' to '0') then FSM 1702 saves the output of DAC $170_1$. At block 1807, if FSM 1702 determines that output of comparator $108_1$ remains the same (i.e., output continues to be a '1' or '0' with no transition relative to the previous state) then at block 1808 FSM 1702 adjusts output current from DAC $170_1$. At block 1809, the adjusted current is added to one of the inputs of comparator $108_1$ (e.g., via Rmix1), and the process continues till output of comparator $108_1$ changes its state.

Program software code/instructions associated with flowchart 1800 executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software."

The program software code/instructions associated with flowchart 1800 typically include one or more instructions stored at various times in various tangible memory and storage devices in or peripheral to the computing device, that, when fetched/read and executed by the computing device, as defined herein, cause a computing device to perform functions, functionalities and operations necessary to perform a method, so as to execute elements involving various aspects of the function, functionalities, and operations of the method(s) forming an aspect of the disclosed subject matter.

For the purposes of this disclosure a module is a software, hardware, or firmware (or combinations thereof) system, process or functionality, or component thereof, that performs or facilitates the processes, features, and/or functions, functionalities and/or operations described herein (with or without human interaction or augmentation) as being performed by the identified module. A module can include sub-modules. Software components of a module may be stored on a tangible machine readable medium. Modules may be integral to one or more servers, or be loaded and executed by one or more servers. One or more modules may be grouped into an engine or an application.

A tangible machine readable medium can be used to store program software code/instructions and data that, when executed by a computing device, cause the computing device to perform a method(s) as may be recited in one or more accompanying claims directed to the disclosed subject matter. The tangible machine readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in a same communication session.

The software program code/instructions and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium in entirety at a particular instance of time.

Examples of tangible computer-readable media include but are not limited to recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

Figure 26:
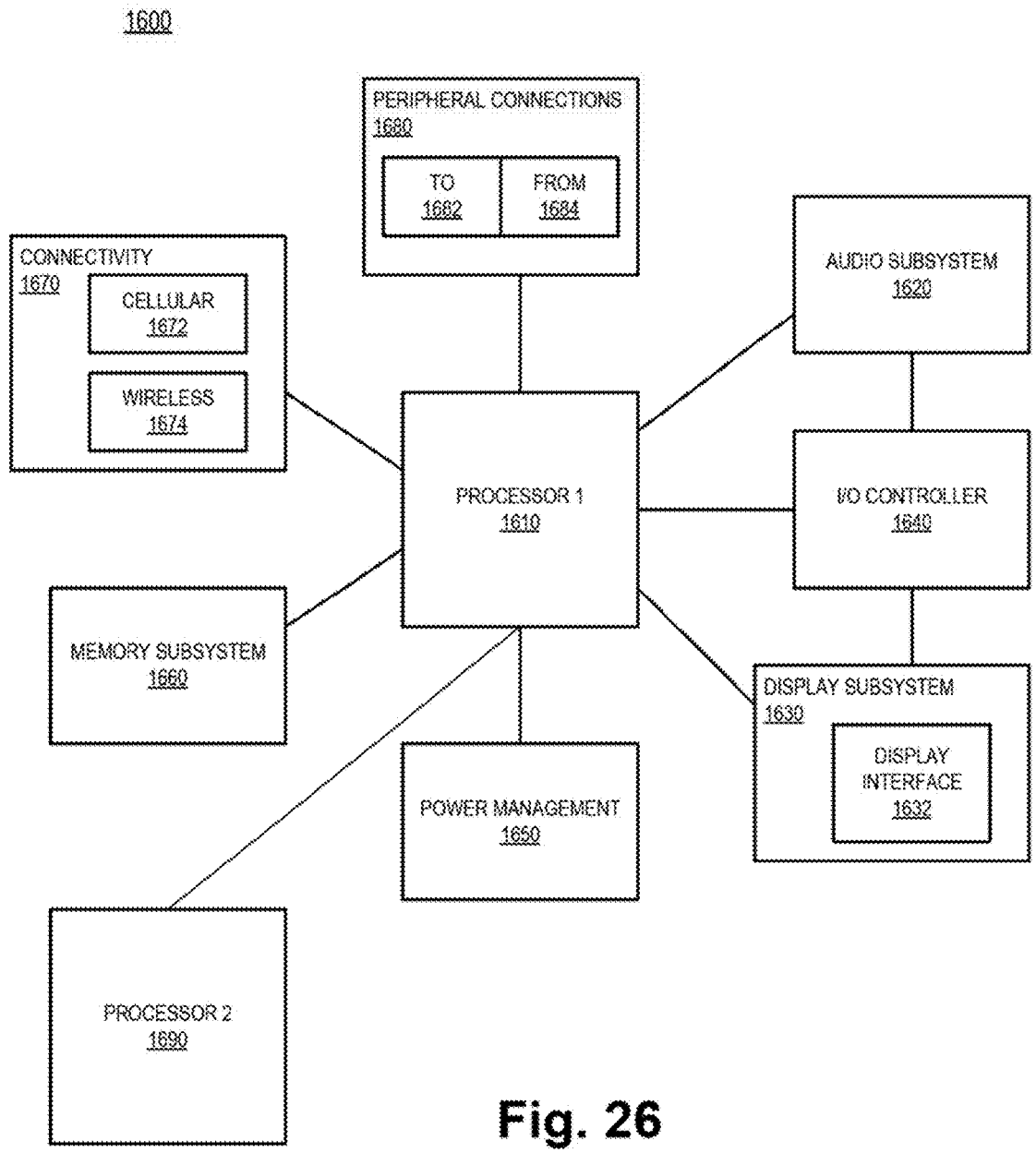
FIG. 26 is a smart device or a computer system or an SoC (system-on-chip) with one or more circuits described with reference to FIGS. 1-25, according to one embodiment of the disclosure.

In general, a tangible machine readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Blackberry® Droid®, or the like, or any other device including a computing device. In one embodiment, processor-based system (e.g., as shown in FIG. 26) is in a form of or included within a PDA, a cellular phone, a notebook computer, a tablet, a game console, a set top box, an embedded system, a TV, a personal desktop computer, etc. Alternatively, the traditional communication applications and subsidized application(s) may be used in some embodiments of the disclosed subject matter.

Figure 19:
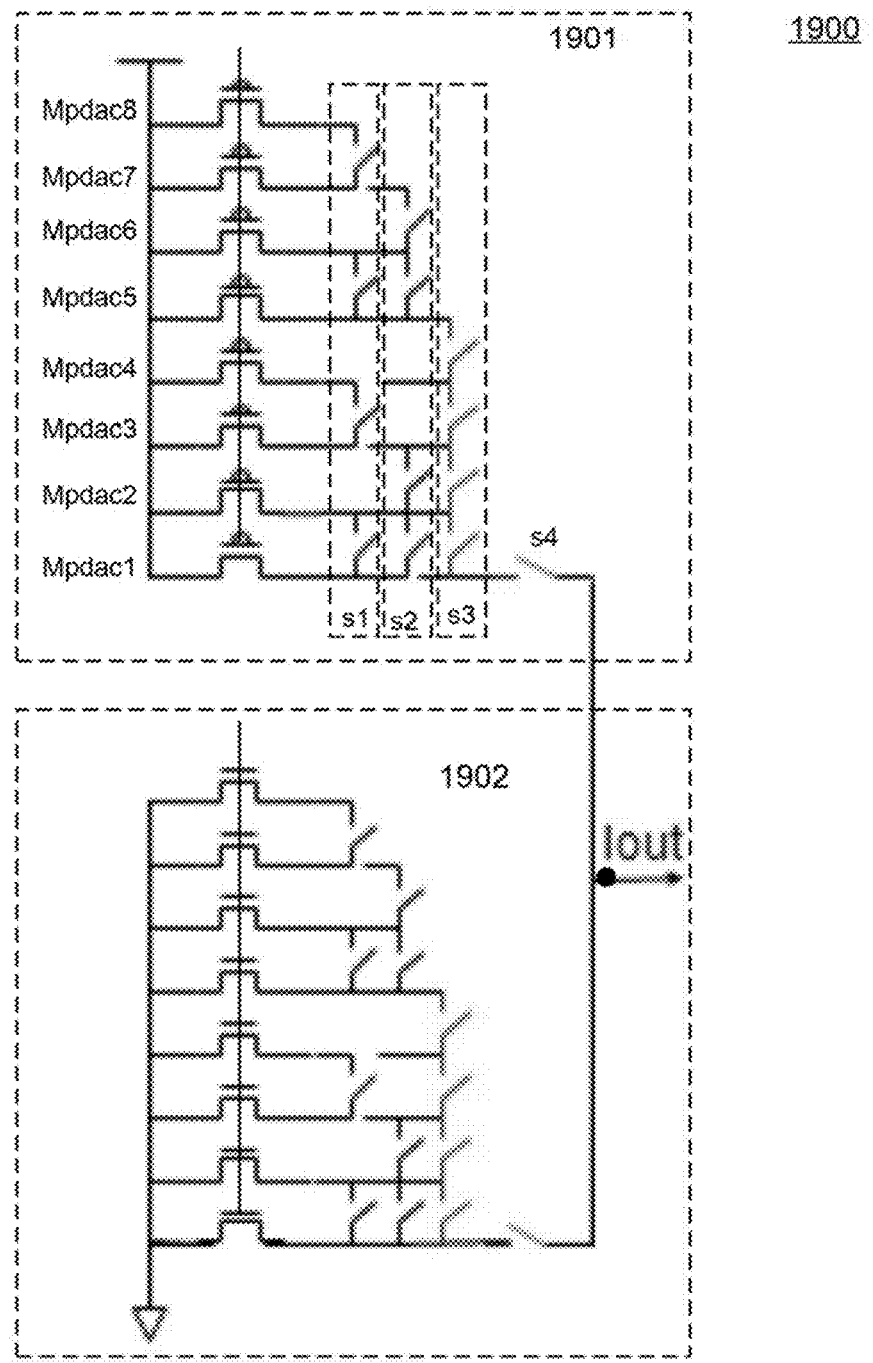
FIG. 19 is a digital-to-analog (DAC) current converter, according to one embodiment of the disclosure.

FIG. 19 is a digital to analog (DAC) current converter 1900 (e.g., as used as 1701), according to one embodiment of the disclosure. It is pointed out that those elements of FIG. 19 having the same reference numbers (or names) as the elements of any other figure can operate or function in any manner similar to that described, but are not limited to such.

In one embodiment, DAC 1900 comprises p-type switch network 1901 and n-type switch network 1902 coupled together to provide output current Tout. In one embodiment, DAC 1900 comprises switches to couple the n-type and/or p-type devices to an output node. In one embodiment, gate terminals of n-type devices are tied to power supply. In one embodiment, gate terminals of p-type devices are tied to ground. In other embodiments, gate terminals of n-type and/or p-type devices biased to other voltage levels. In one embodiment, one of the source/drain terminals of the p-type devices of network 1901 is coupled to power supply and the other drain/source terminals are coupled to one of the switches s1-s4. In one embodiment, one of the source/drain terminals of the n-type devices of network 1902 is coupled to ground and the other drain/source terminals are coupled to one of the switches s1-s4.

Switch networks 1901 and 1902 are designed to be controlled by binary coding but they behave as what thermometer coding behaves, according to one embodiment. Therefore, switch networks 1901 and 1902 enable monotonic switching and does not require any binary-to-thermometer decoder. For example, switch network is designed to be controlled by binary coding but it behaves as what thermometer coding behaves i.e., lower area and power consumption is achieved by DAC 1900 compared to traditional DACs.

The embodiment of FIG. 19 is explained with reference to p-type switch 1901. The same explanation applies to n-type switch 1902. The following embodiment uses 4 bits one binary code to control four sets of switches—s1, s2, s3, and s4. In one embodiment, s1 is controlled by LSB (least significant bit) and s4 is controlled by MSB (most significant bit), and where s2 and s3 are controlled by LSB+1, and LSB+2 bits of the binary code.

For example, when s1,s2,s3,s4={0,0,0,0}, output node (Tout) is tri-stated; when s1,s2,s3,s4={0,0,0,1}, output current Tout comes from Mpdac1; when s1,s2,s3,s4={1,0,0,1}, output current Tout comes from Mpdac1 and MPdac2 i.e., current output doubles; when s1,s2,s3,d4={1,1,0,1}, output current Tout comes from Mpdac1, MPdac2, and Mpdac3, i.e., further monotonic increase in current; when s1,s2,s3,s4={1,1,1,1}, then output current Tout comes from Mpdac1-8. In one embodiment, each of Mpdac1-8 are of same size to provide incremental current to Tout according to binary code s1-s4.

The following embodiments describe apparatus and method of compensating reference voltage for compensator 103.

Figure 20:
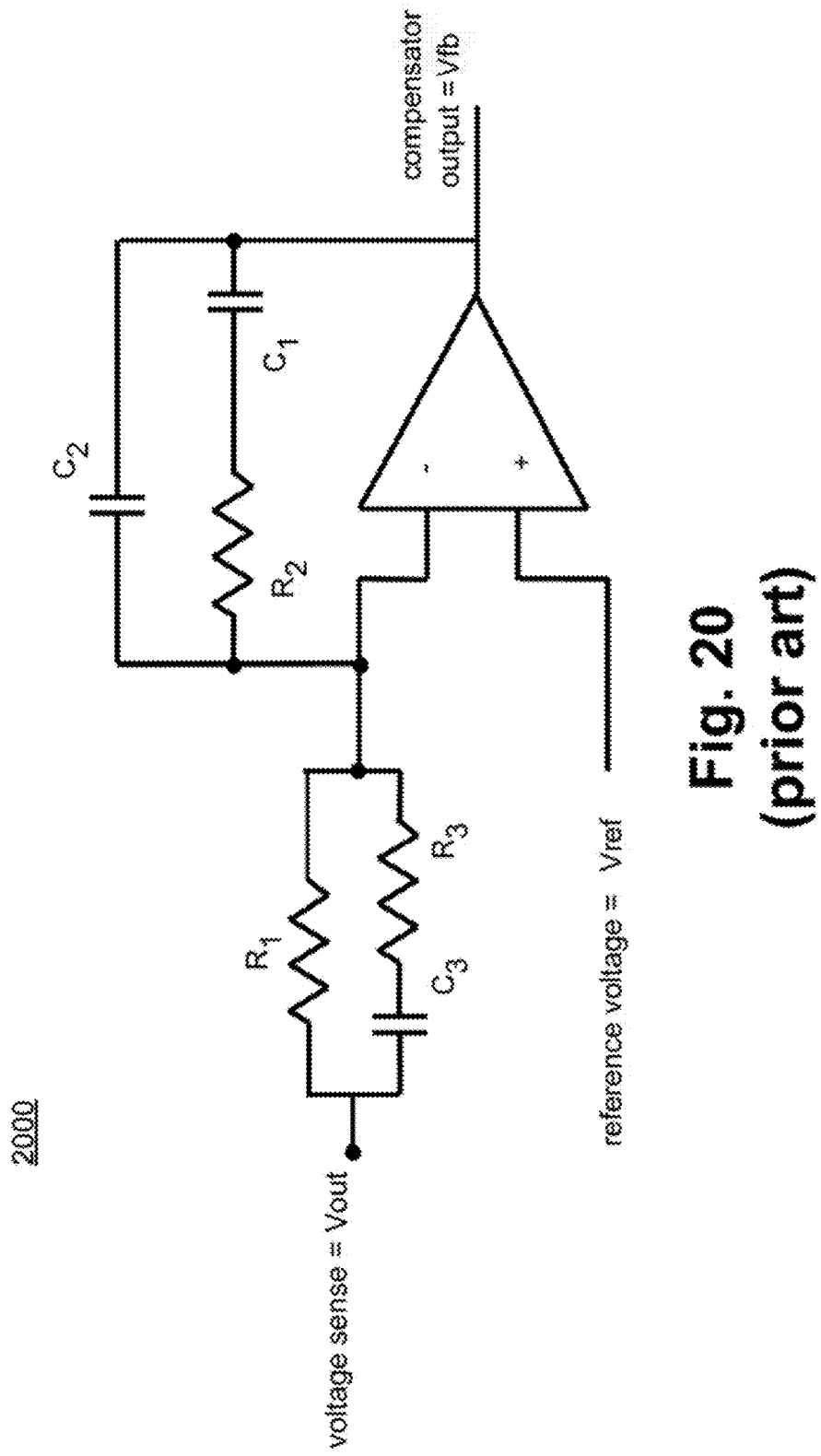
FIG. 20 is a conventional type-3 compensator.

A buck converter contains a feedback loop formed of a sense line, compensator, pulse width modulator (PWM), signaling to the power train, etc., to keep the output voltage Vout close to a set reference voltage Vref. The output voltage Vout is the voltage provided to a load. The compensator in voltage-mode-control buck converters is usually a classic type-3 compensator using either discrete or precision integrated passive resistor and capacitor components. The bandwidth of a conventional compensator is up to approximately 1 MHz. One such conventional type-3 compensator is shown in FIG. 20. The conventional type-3 compensator 2000 comprises an amplifier to receive a reference voltage Vref and output Vout via a resistor-capacitor network (R1, R3, C3). The output of the amplifier is coupled to one of the input terminals of the amplifier via another resistor-capacitor network (R2, C1 and C2).

A compensator for Integrated Voltage Regulators (IVR) differs from conventional compensators in that it operates at much higher bandwidths (e.g., greater than 100 MHz), it is subjected to much higher noise levels on the die (coupled through the substrate, power supplies, and surrounding/crossing signals), its pole and zero frequencies need to be on-die configurable in wide ranges, the resistor and capacitor components have relatively large parasitic capacitance and resistance and vary across process corners, and voltage levels are limited to the process Vmax, which is, for example, approximately 1V or less in a typical digital lead process.

Some embodiments describe a fully differential design, which has no (or substantially zero) first-order sensitivity to substrate noise or common-mode noise on sense lines or reference lines. In one embodiment, the fully differential design supports output voltages higher than the process Vmax. In one embodiment, the fully differential design is configurable in wide ranges for various parameters. In one embodiment, the fully differential design includes DFT (Design-for-Test) features for closed-loop testing at sort (where inductors are not connected yet) and to characterize the frequency response.

Figure 21:
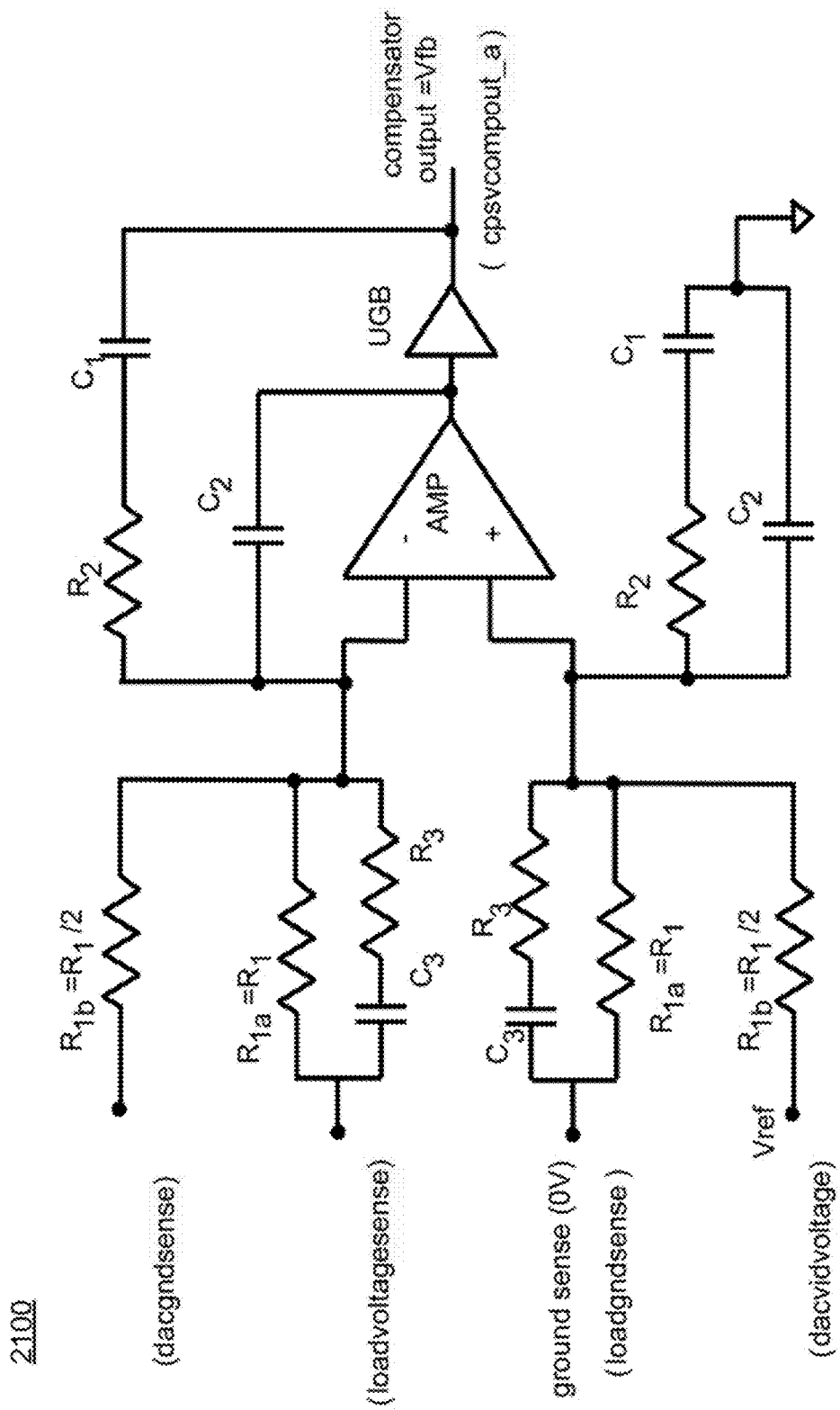
FIG. 21 is a differential type-3 compensator, according to one embodiment of the disclosure.

FIG. 21 is a differential type-3 compensator 2100 (e.g., 103), according to one embodiment of the disclosure. It is pointed out that those elements of FIG. 21 having the same reference numbers (or names) as the elements of any other figure can operate or function in any manner similar to that described, but are not limited to such.

In one embodiment, differential type-3 compensator 2100 comprises a differential amplifier (AMP), passive resistors with values R1a, R1b, duplicate passive resistors R2 and R3, duplicate passive capacitors C1, C2, and C3, and unity gate buffer (UGB). In one embodiment, UGB is optional. In one embodiment, R1b=R1/2 and R1a=R1.

Figure 25:
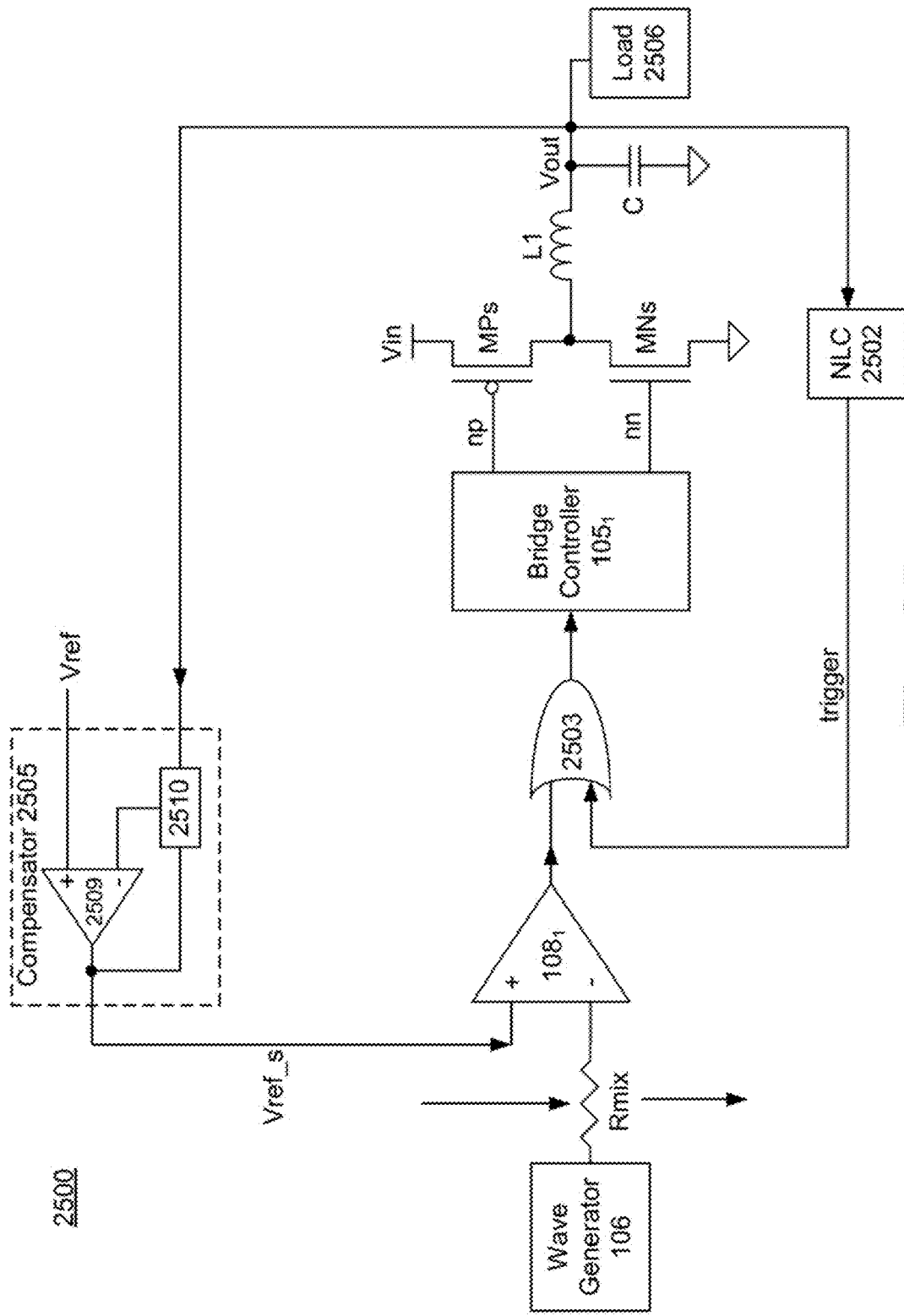
FIG. 25 is part of a voltage regulator apparatus with the differential type-3 compensator, according to one embodiment of the disclosure.

In one embodiment, differential inputs (signal and ground) for Vout and Vref are received by the passive devices and eventually as inputs to the differential amplifier. The term "dacgndsense" refers to the ground node near the DAC (e.g., DAC in NLC 102 of FIG. 25). The term "loadvoltagesense" refers to node Vout near the load (e.g., Vout near Load 106 of FIG. 25). The term "loadgndsense" refers to ground node near the load (e.g., ground near Load 106 of FIG. 25). The term "dacvidvoltage" refers to reference voltage Vref (e.g., as shown in FIG. 25).

In one embodiment, the resistor network comprises passive resistors with values R1a and R1b such that Vout=Vref× R1a/R1b. In one embodiment, (R1a/R1b)=2 to support conditions when Vout is greater than Vccags, where Vccags is an analog power supply. In other embodiments, other ratios for R1a/R1b may be used.

In one embodiment, duplicate passive devices (i.e., R2, R3, C1, C2, and C3) are coupled together as shown in FIG. 21. In one embodiment, the coupling of the duplicate passive devices is such that the frequency response (i.e., of Vout/Vfb) is preserved. In one embodiment, the coupling of the duplicate passive devices is such that any common-mode noise on voltage sense/ground sense or reference voltage/reference ground nodes is canceled.

In one embodiment, the coupling of the duplicate passive devices is such that any substrate or supply noise coupled through passives' parasitic into the amplifier (AMP) positive and negative inputs is approximately identical, so that it has no net (or substantially zero net) effect on Vfb. In one embodiment, the passive devices are trimmed to ensure that any RC time constant is approximately on target in spite of process variation e.g., systematic process variation.

In one embodiment, UGB is used to reduce the capacitive load on the amplifier output. In such an embodiment, a single-stage amplifier design can be used for the differential amplifier to preserve phase margin. In one embodiment, a multi-instance design of the amplifier with gated output stage is used, so that the compensator bandwidth can be configured to reduce power consumption.

Figure 22:
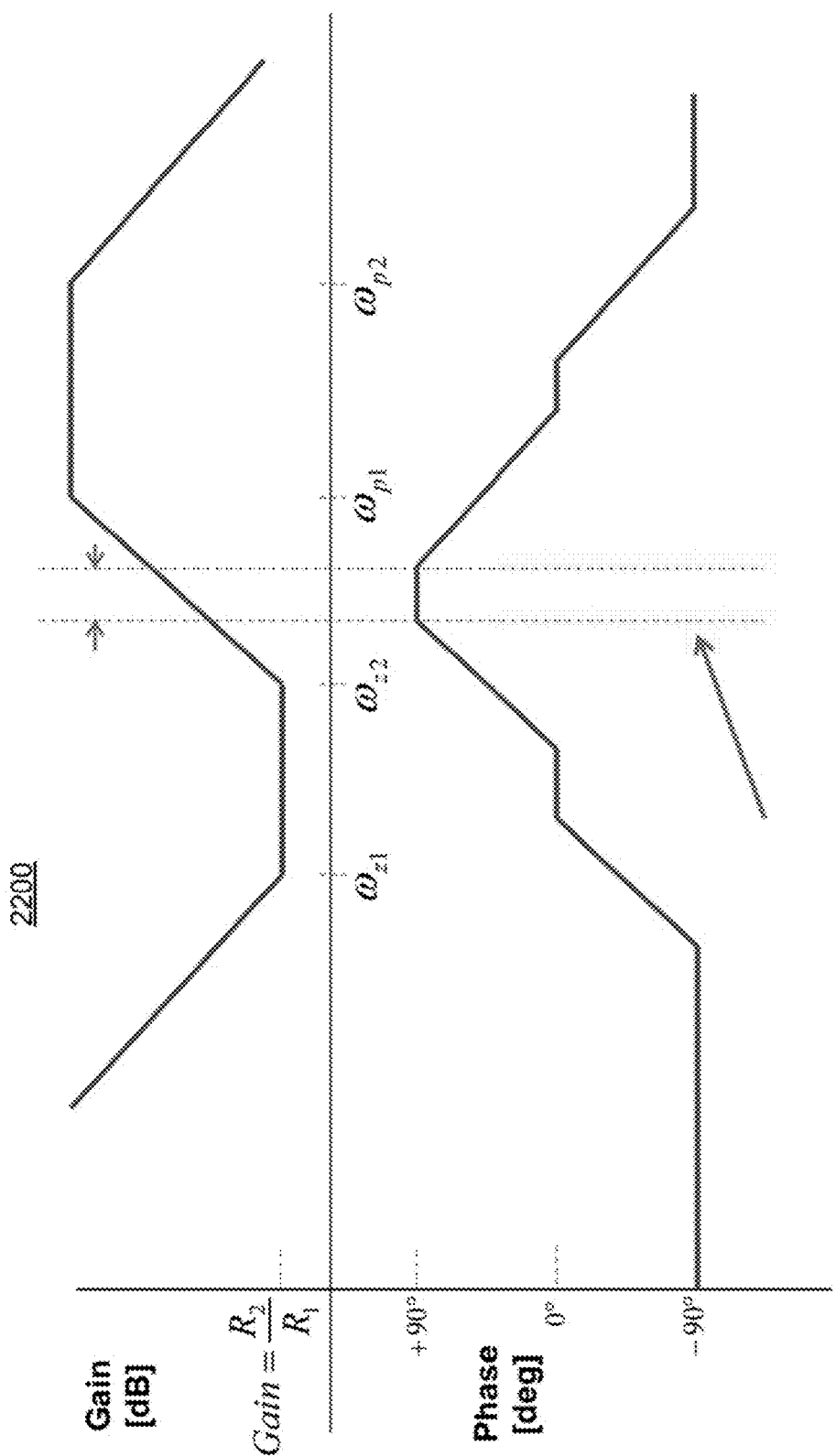
FIG. 22 is a frequency response of the differential type-3 compensator, according to one embodiment of the disclosure.

FIG. 22 is a frequency response 2200 of the differential type-3 compensator, according to one embodiment of the disclosure. It is pointed out that those elements of FIG. 22 having the same reference numbers (or names) as the elements of any other figure can operate or function in any manner similar to that described, but are not limited to such.

The frequency response 2200 has two plots. The top plot shows the gain (i.e., R2/R1) in dB versus frequency. The bottom plot shows the phase angle in degrees versus frequency. The vertical dotted lines illustrate that the maximum phase boost occurs at frequencies which are approximately one decade greater than $\omega_{z2}$ and approximately one decade less than $\omega_{p1}$, where:

$$\omega_{z1} = \frac{1}{R_2 C_1} \quad \omega_{z2} \approx \frac{1}{R_1 C_3} \quad \omega_{p1} \approx \frac{1}{R_2 C_2} \quad \omega_{p2} = \frac{1}{R_3 C_3}$$

Figure 23:
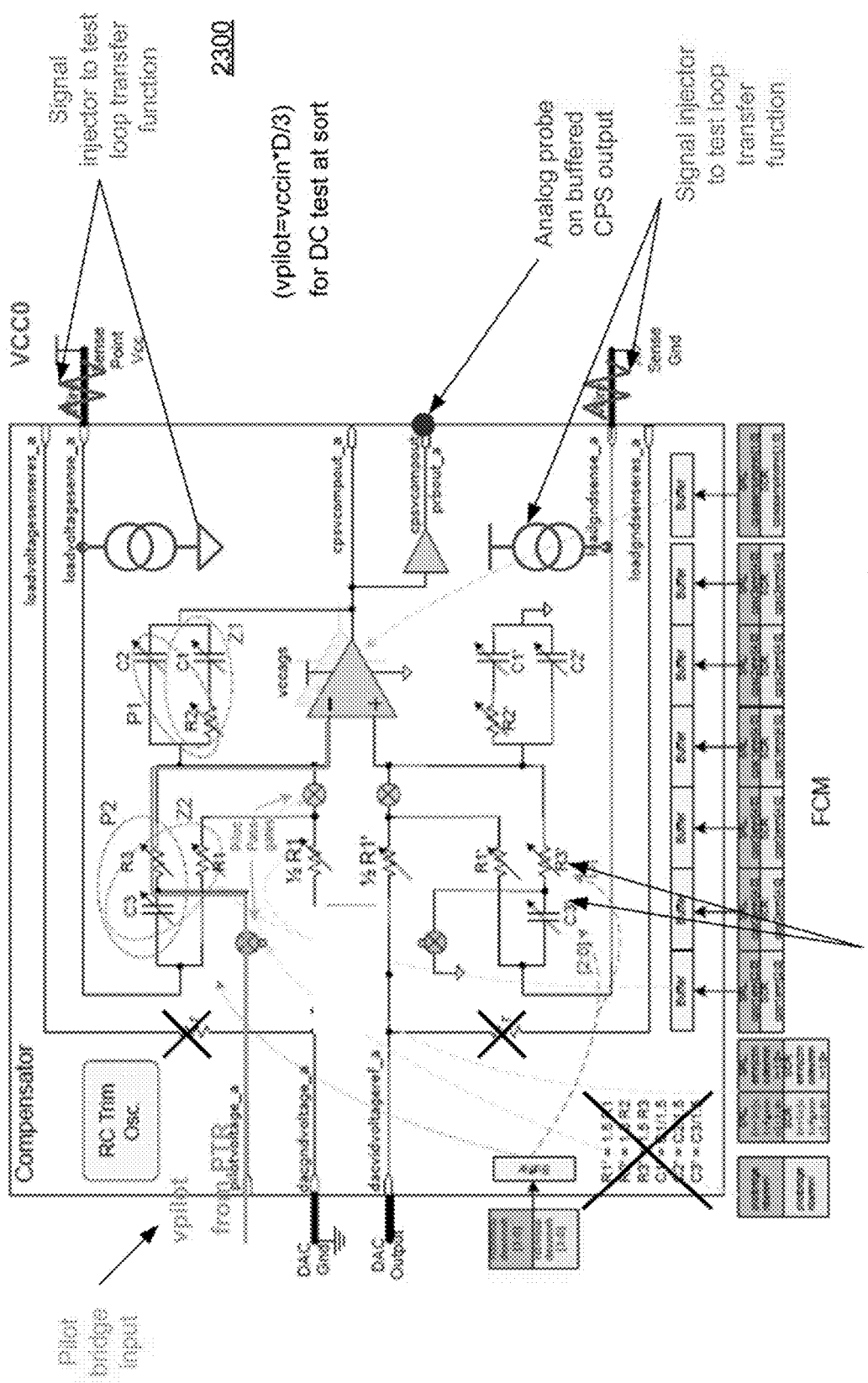
FIG. 23 is the differential type-3 compensator with DFT (Design-for-Test) features and configuration schemes, according to one embodiment of the disclosure.

FIG. 23 is the differential type-3 compensator 2300 with DFT (Design for Test) features and configuration schemes, according to one embodiment of the disclosure. It is pointed out that those elements of FIG. 23 having the same reference numbers (or names) as the elements of any other figure can operate or function in any manner similar to that described, but are not limited to such.

In one embodiment, an input is coupled to a pilot bridge producing an output voltage Vpilot=D*Vin/3, where D is the PWM (pulse width modulated) duty cycle, such that the feedback loop (of the voltage regulator) can be closed during testing at sort to allow structural testing without inductors. In one embodiment, a pair of digitally controlled current sources are coupled at the voltage and ground sense inputs, such that I*R drop on the sense lines (and/or optional small series resistors) has the effect of a voltage added to Vout.

In one embodiment, this voltage may be a periodic waveform, e.g. a square wave, which can be configured in frequency and amplitude. The response of Vout to this voltage (closed-loop response) can be used to characterize the VR open loop transfer function. In one embodiment, the UGB is used to generate a copy of the compensator output Vfb for analog probing (without undue loading of Vfb).

Figure 24:
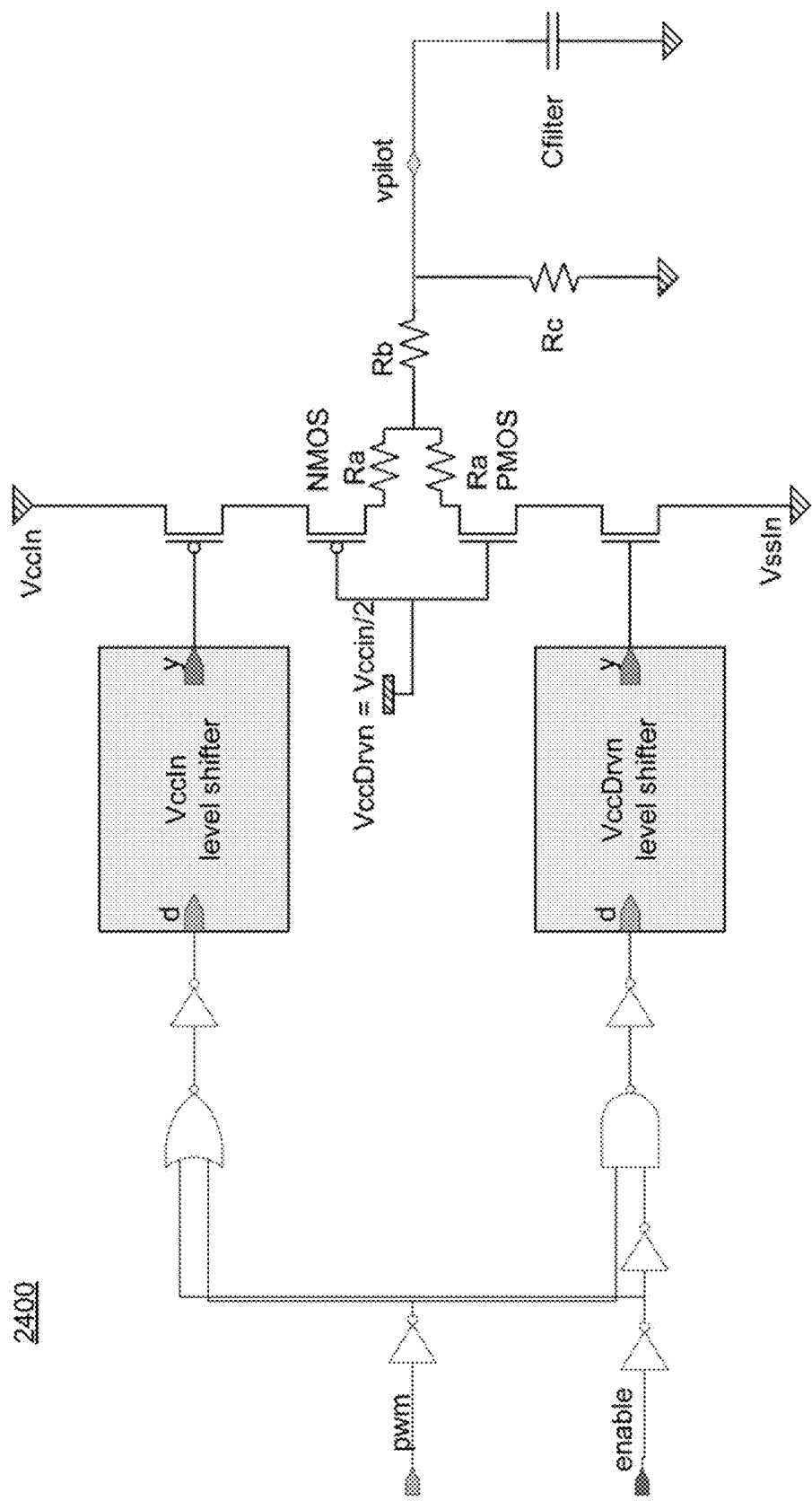
FIG. 24 is a pilot bridge, according to one embodiment of the disclosure.

FIG. 24 is a pilot bridge 2400, according to one embodiment of the disclosure. It is pointed out that those elements of FIG. 24 having the same reference numbers (or names) as the elements of any other figure can operate or function in any manner similar to that described, but are not limited to such.

In one embodiment, the pilot bridge 2400 is a small replica of a power train, where the inductor is replaced by a resistor (Ra+Rb). In one embodiment, Resistors Ra prevents short-circuit between the NMOS and PMOS devices coupled to Resistor Rb. In one embodiment, Resistor Rc is used to scale the pilot bridge output voltage vpilot by Rc/(Ra+Rb+Rc), which is optional. In one embodiment, the scaling factor is ⅓. In other embodiments, other scaling factors may be used. In one embodiment, the capacitor Cfilter reduces the ripple on vpilot, which is optional (because interconnect parasitic capacitance may sufficient).

In one embodiment, the average of vpilot for a given PWM duty cycle D is vpilot=Vccin*D*(Rc/(Ra+Rb+Rc)). This is used for testing in lieu of the actual output voltage (Vccin*D) when inductors are not present or when the power train is not enabled. In one embodiment, the outputs (of the pilot bridges) of all phases in a domain are coupled in parallel, so that vpilot is the average of all phases' pilot bridge outputs.

FIG. 25 is part of a voltage regulator apparatus 2500 with the differential type-3 compensator, according to one embodiment of the disclosure. It is pointed out that those elements of FIG. 25 having the same reference numbers (or names) as the elements of any other figure can operate or function in any manner similar to that described, but are not limited to such.

In one embodiment, apparatus 2500 comprises a Bridge Controller $105_1$, high-side switch(es) MPs, low-side switch(es) MNs, while are part of $101_1$, main inductor L1, load capacitor C, NLC unit 2502, Override logic 2503, Comparator $108_1$, Compensator 2505, Load 2506, Rmix resistor, and Wave Generator 106.

In one embodiment Bridge Controller $105_1$ controls when to turn on and/or off high-side and low-side switches (MPs and MNs) via gate control signals np and nn respectively. In one embodiment, low-side switch is replaced with a diode. In normal operation of voltage regulation, Bridge Controller $105_1$ receives output of Comparator $108_1$ to determine when to turn on and/or off high-side and low-side switches (MPs and MNs).

For example, Comparator $108_1$ compares a modulated wave generated by Wave Generator 106 with a reference voltage (e.g., Vref_s) to generate switching signal, the switching signal indicating when the modulated wave is above and below reference voltage Vref_s. In normal operation, Override logic 2503 behaves like a buffer and passes on the output of Comparator $108_1$ to Bridge Controller $105_1$. The term "normal operation" generally refers to stable voltage and current draw by load 2506 i.e., when output voltage is not drooping. Normal operation is different from voltage droop situation when Load 2506 suddenly draws more current causing voltage Vout to droop.

In one embodiment, high-side switch MPs and low-side switch MNs form the bridge of the voltage regulator. In one embodiment, the low-side switch MNs is replaced with a diode. In such an embodiment, Bridge Controller $105_1$ effectively controls the output voltage by turning on/off high-side switch MPs. In one embodiment, the bridge receives input supply voltage Vin and generates a regulated output voltage Vout for Load 2506. In one embodiment, the switching of current through main inductor L1 and charging/discharging of capacitor C by the bridge keeps Vout stable.

In one embodiment, when voltage droop occurs on Vout, NLC unit 2502 detects voltage droop relative to a reference voltage and generates a trigger signal (also referred as NLCFired signal). In one embodiment, assertion of the trigger signal engages Override logic 2503 to bypass output of Comparator $108_1$ and directly control Bridge Controller $105_1$. In one embodiment, Override logic 2503 is coupled to comparator $108_1$ and Bridge Controller $105_1$. In one embodiment, Override logic 2503 performs an OR logic function on outputs of Comparator $108_1$ and trigger signal. In one embodiment, override logic 2503 is an OR gate. In other embodiments, Override logic 2503 is any logic gate which is operable to override output of Comparator $108_1$ in response to assertion of the trigger signal.

In one embodiment, when trigger signal is asserted (i.e., when voltage droop on Vout is detected by NLC unit 2502), high-side switch MPs is turned on and low-side switch MNs is turned off. In one embodiment, trigger signal is a pulse signal having a pulse width indicative of the duration of the voltage droop. In one embodiment, pulse width of trigger signal is adjustable by a Pulse Adjuster (not shown). In such an embodiment, high-side switch MPs is turned on and low-side switch MNs is turned off for the duration of the pulse width of the trigger signal. In one embodiment, when trigger signal de-asserts, Override logic 2503 allows output of Comparator $108_1$ to continue control of Bridge Controller $105_1$. In one embodiment, NLC unit 2502 is Alternating Current (AC) coupled to Vout to generate trigger signal.

In one embodiment, output voltage Vout is received by Compensator 2505. In one embodiment, Compensator 2505 scales reference voltage Vref as Vref_s for Comparator $108_1$. In one embodiment, Compensator 2505 comprises a Comparator 2509 coupled to passive devices 2510 as shown. In one embodiment, passive devices 2510 receive output voltage Vout. In one embodiment, Compensator 2505 adjusts Vref_s in response to voltage droop on Vout so that when droop ends and Override logic 2503 allows output of Comparator $108_1$ to control Bridge Controller $105_1$, Vout achieves its normal voltage level as stably as possible.

In one embodiment, Compensator 2505 provides feedback and a transfer function necessary to stabilize the VR system such that nominally Vout is substantially equal to Vref while accounting for steady state load and low-frequency transient load conditions. In one embodiment, the transfer function of Compensator 2505 is used to optimally tune the VR loop's transfer function.

In one embodiment, Wave Generator 106 generates a triangular wave for Comparator $108_1$. The output of Comparator $108_1$ is a pulse width modulated (PWM) signal. In one embodiment, Rmix resistor is used to subtract Iavg from Iphase as discussed with other embodiments. In one embodiment, apparatus 2505 has a circuit to trim out offset of Comparator $108_1$. In one embodiment, Rmix resistor is used to achieve phase current balancing for multi-phase buck VRs. In one embodiment, current is injected or sunk to/from various tap points on a potentiometer (i.e., adjustable resistor); this shifts the average output voltage from Wave Generator 106 seen at Comparator $108_1$.

So as not to obscure the embodiment of FIG. 6, one Bridge Controller $105_1$, one set of high-side and low-side switches (MPs and MNs), and one main inductor L1 is shown. However, the embodiments can operate with a plurality of bridge controllers each of which controls its own set of bridges (i.e., high-side and low-side switches) coupled to its own inductor or to the main inductor L1 i.e., a multi-phase buck VR. In such an embodiment, a plurality of comparators is used such that each comparator drives a bridge instance or "phase." In one embodiment, output of each comparator of the plurality of comparators $108_1$ is received by override logic 2503 which is used to override output of the comparators when voltage droop is detected by NLC 2502. In such an embodiment, all bridge controllers turn on their respective high-side switches and turn off their low-side switches during voltage droop on Vout. In this embodiment, Wave Generator 106 generates a plurality of waves that are substantially identical except for phase offset. In one embodiment, each phase is trimmed separately via Rmix.

In one embodiment, during low power mode operation of apparatus 2500 having multi-phase bridge drivers where some of the phases are off to save power (i.e., those bridges are not driving) while some phases are on to generate Vout with low current demand, when a voltage droop on Vout is detected by NLC unit 2502, the bridges which are off (to save power) are forcefully turned on by the Override logic 2503 to mitigate the voltage droop effect. In one embodiment, not all bridges which were off are forcefully turned on, but phases (i.e., bridges to generate the phases) which are already enabled are forcefully turned on.

FIG. 26 is a smart device or a computer system or an SoC (system-on-chip) 1600 with one or more circuits and methods described with reference to FIGS. 1-25, according to one embodiment of the disclosure. It is pointed out that those elements of FIG. 26 having the same reference numbers (or names) as the elements of any other figure can operate or function in any manner similar to that described, but are not limited to such.

FIG. 26 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with one or more circuits and methods described with reference to the embodiments of FIGS. 1-25. Other blocks of the computing device 1600 may also include with one or more circuits and methods described with reference to the embodiments of FIGS. 1-25. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display M.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a plurality of inductors coupled to a capacitor and a load; a plurality of bridges, each of which is coupled to a corresponding inductor from the plurality of inductors; and a plurality of current sensors, each of which is coupled to a bridge to sense current through a transistor of the bridge. In one embodiment, the apparatus further comprises circuit to generate an average current using sensed current from each of the current sensors of the plurality of current sensors. In one embodiment, the apparatus further comprises: a wave generator to generate a plurality of wave signals; a plurality of comparators to generate a plurality of phase width modulated (PWM) signals; and a plurality of resistors, each of which is coupled to a comparator of the plurality of comparators, and coupled to the wave generator.

In one embodiment, each resistor of the plurality of resistors to generate an error current from a difference of the average current and a corresponding sensed current of the bridge. In one embodiment, each resistor of the plurality of resistors to generate a direct current (DC) voltage to adjust a DC level of a wave signal from the plurality of wave signals. In one embodiment, each comparator to adjust duty cycle of its generated PWM signal according to the DC voltage generated by the resistor coupled to the comparator.

In one embodiment, the wave generator to generate the plurality of wave signals which are triangular waves. In one embodiment, the apparatus further comprises a circuit for cancelling input offset of each comparator of the plurality of comparators. In one embodiment, the further comprises an over current protection circuit to receive the average current and to generate an over current protection signal according to the average current. In one embodiment, the apparatus further comprises a power control unit (PCU) to receive the average current.

In one embodiment, each current sensor comprises: a first current sensor for sensing current through a high-side switch of the bridge; and a second current sensor for sensing current through a low-side switch of the bridge. In one embodiment, the first and second current sensors include a common gate amplifier. In one embodiment, each of the first and second current sensors to generate a corresponding differential current output.

In one embodiment, the apparatus further comprises a circuit to convert the corresponding differential current output to a corresponding single-ended current output. In one embodiment, the first current sensor is coupled to the second current sensor to generate a combined differential current output. In one embodiment, the apparatus further comprises a circuit to convert the combined differential current output to a single ended current output.

In another example, in one embodiment, a system comprising: a memory unit; a processor coupled to the memory unit, the processor including: a plurality of inductors coupled to a capacitor and a load; a plurality of bridges, each of which is coupled to a corresponding inductor from the plurality of inductors; and a plurality of current sensors, each of which is coupled to a bridge to sense current through a transistor of the bridge; and a wireless interface for allowing the processor to communicate with another device.

In one embodiment, the system further comprises a display unit. In one embodiment, the processor further comprises: circuit to generate an average current using sensed current from each of the current sensors of the plurality of current sensors; a wave generator to generate a plurality of wave signals; a plurality of comparators to generate a plurality of phase width modulated (PWM) signals; and a plurality of resistors, each of which is coupled to a comparator of the plurality of comparators, and coupled to the wave generator. In one embodiment, each resistor of the plurality of resistors to generate an error current from a difference of the average current and a corresponding sensed current of the bridge.

In another example, in one embodiment, a current digital to analog converter (DAC) comprises: a plurality of n-type devices, gate terminals of which are coupled to a first control signal, wherein source terminal of each of the n-type devices is coupled to ground; and a plurality of switches, for coupling drain terminals of some or all of the n-type devices with one another, to generate a first current output.

In one embodiment, the current DAC further comprises: a plurality of p-type devices, gate terminals of which are coupled to a second control signal, wherein source terminal of each of the p-type devices is coupled to a power supply; and a plurality of switches, for coupling drain terminals of some or all of the p-type devices with one another, to generate a second current output. In one embodiment, the current DAC further comprises: an output node for coupling the first and second current outputs.

In one embodiment, the plurality of p-type and n-type devices are controlled by digital signals to cause any of the plurality of p-type and n-type devices to turn on or off. In one embodiment, the digital signals are a binary code, and wherein the output node to generate a monotonic change in current according to the binary code.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   an input supply node;
   a high-side switch coupled to the input supply node;
   a low-side switch coupled in series with the high-side switch such that there is a common node coupled to the low-side switch and the high-side switch, wherein the common node is to be coupled to an inductor; and
   a current sensor coupled with the high-side switch and also coupled to the common node, wherein the current sensor is to sense current through the high-side switch, wherein the current sensor is to turn off in accordance with a voltage condition associated with the common node.

2. The apparatus of claim 1, wherein the current sensor is coupled in parallel with the high-side switch.

3. The apparatus of claim 1, wherein the current sensor comprises a current mirror.

4. The apparatus of claim 1, wherein the current sensor is to turn off to avoid incorrect current measurement.

5. The apparatus of claim 1, wherein the current sensor is turned on when the high-side switch is conductive.

6. The apparatus of claim 1, wherein the high-side switch comprises a p-type transistor, and wherein the low-side switch comprises an n-type transistor.

7. The apparatus of claim 1, wherein the inductor is coupled to a capacitor.

8. The apparatus of claim 1, wherein the inductor is coupled to a load.

9. The apparatus of claim 1 comprises a second current sensor coupled with the low-side switch and also coupled to the common node, wherein the second current sensor is operable to sense current through the low-side switch.

10. The apparatus of claim 9, wherein the second current sensor is coupled in parallel with the low-side switch.

11. The apparatus of claim 1 comprises:
    a first driver coupled to the high-side switch, wherein the first driver is to turn on and/or off at least one transistor of the high-side switch; and
    a second driver coupled to the low-side switch, wherein the second driver is to turn on and/or off at least one transistor of the low-side switch.

12. The apparatus of claim 11 comprises a pulse switch modulator (PWM) to generate a signal which is used to drive one of the first and second drivers.

13. An apparatus comprising:
    an input supply node;
    a high-side switch coupled to the input supply node;
    a low-side switch coupled in series with the high-side switch such that there is a common node coupled to the low-side switch and the high-side switch, wherein the common node is to be coupled to an inductor;
    a current sensor coupled with the high-side switch and also coupled to the common node, wherein the current sensor is to sense current through the high-side switch; and
    a voltage indication circuit coupled to the common node to turn off the current sensor according to a voltage condition associated with the common node.

14. The apparatus of claim 13, wherein the current sensor is coupled in parallel with the high-side switch.

15. The apparatus of claim 13, wherein the current sensor comprises a current mirror.

16. An apparatus comprising:
a first DC-DC converter coupled to a load, wherein the first DC-DC converter comprises:
an input supply node;
a high-side switch coupled to the input supply node;
a low-side switch coupled in series with the high-side switch such that there is a common node coupled to the low-side switch and the high-side switch, wherein the common node is to be coupled to an inductor; and
a current sensor coupled with the high-side switch and also coupled to the common node, wherein the current sensor is to sense current through the high-side switch,
wherein the current sensor is to turn off in accordance with a voltage condition associated with the common node; and
a second DC-DC converter coupled to the load, wherein the second DC-DC converter comprises:
an input supply node;
a high-side switch coupled to the input supply node;
a low-side switch coupled in series with the high-side switch such that there is a common node coupled to the low-side switch and the high-side switch, wherein the common node is to be coupled to the inductor; and
a current sensor coupled with the high-side switch and also coupled to the common node, wherein the current sensor is to sense current through the high-side switch,
wherein the current sensor of the second DC-DC converter is to turn off in accordance with a voltage condition associated with the common node.

17. The apparatus of claim 16, wherein the current sensor of the first DC-DC converter and the current sensor of the second DC-DC converter is coupled in parallel with their respective high-side switches.

18. The apparatus of claim 16, wherein the first DC-DC converter and the second DC-DC converter are to be coupled to the same inductor.

19. The apparatus of claim 16, wherein the first DC-DC converter and the second DC-DC converter are to be coupled to different inductors.

20. An apparatus comprising:
a first DC-DC converter coupled to a load, wherein the first DC-DC converter comprises:
an input supply node;
a high-side switch coupled to the input supply node;
a low-side switch coupled in series with the high-side switch such that there is a common node coupled to the low-side switch and the high-side switch, wherein the common node is coupled to a first inductor; and
a current sensor coupled with the high-side switch and also coupled to the common node, wherein the current sensor is to sense current through the high-side switch,
wherein the current sensor is to turn off in accordance with a voltage condition associated with the common node; and
a second DC-DC converter coupled to the load, wherein the second DC-DC converter comprises:
an input supply node;
a high-side switch coupled to the input supply node;
a low-side switch coupled in series with the high-side switch such that there is a common node coupled to the low-side switch and the high-side switch, wherein the common node is coupled to a second inductor; and
a current sensor coupled with the high-side switch and also coupled to the common node, wherein the current sensor is to sense current through the high-side switch,
wherein the current sensor of the second DC-DC converter is to turn off in accordance with a voltage condition associated with the common node.

21. The apparatus of claim 20, wherein the first and second inductors are the same inductors.

22. The apparatus of claim 20, wherein the first and second inductors are separate inductors.

23. An apparatus comprising:
an input supply node;
a high-side switch coupled to the input supply node;
a low-side switch coupled in series with the high-side switch such that there is a common node coupled to the low-side switch and the high-side switch, wherein the common node is to be coupled to an inductor; and
a current sensor coupled with the high-side switch and also coupled to the common node, wherein the current sensor is to sense current through the high-side switch,
wherein the current sensor is to turn off in accordance with a current condition associated with the common node.

24. The apparatus of claim 23, wherein the current sensor is coupled in parallel with the high-side switch.

25. The apparatus of claim 23, wherein the current sensor comprises a current mirror.

26. A system comprising:
a memory;
a processor coupled to the memory, wherein the processor include a voltage regulator comprising:
an inductor;
a capacitor;
an input supply node;
a high-side switch coupled to the input supply node;
a low-side switch coupled in series with the high-side switch such that there is a common node coupled to the low-side switch and the high-side switch, wherein the common node is to be coupled to the inductor; and
a current sensor coupled with the high-side switch and also coupled to the common node, wherein the current sensor is to sense current through the high-side switch,
wherein the current sensor is to turn off in accordance with a voltage condition associated with the common node; and
a wireless interface to allow the processor to communicate with another device.

27. The system of claim 26, wherein the current sensor is coupled in parallel with the high-side switch.

28. The system of claim 26, wherein the current sensor comprises a current mirror.

29. A method comprising:
sensing current through a high-side switch; and
turning off the current sensor according to a voltage condition associated with a common node coupled to the high-side switch.

30. The method of claim 29 comprises generating a pulse switch modulating (PWM) signal to drive a driver coupled to the high-side switch.

31. An apparatus comprising:
   means for sensing current through a high-side switch; and
   means for turning off the current sensor according to a voltage condition associated with a common node coupled to the high-side switch.

32. The apparatus of claim 31 comprises means for generating a pulse switch modulating (PWM) signal to drive a driver coupled to the high-side switch.

* * * * *